US012567834B2

(12) United States Patent　　　　(10) Patent No.:　US 12,567,834 B2
Hsieh et al.　　　　　　　　　　　(45) Date of Patent:　　Mar. 3, 2026

(54) FREQUENCY GENERATING DEVICE AND OPERATION METHOD THEREOF

(71) Applicant: TXC Corporation, Taipei City (TW)

(72) Inventors: Wan-Lin Hsieh, Taoyuan City (TW); Wen-Cheng Wang, Taoyuan City (TW); Sheng-Hsiang Kao, Taipei City (TW)

(73) Assignee: TXC Corporation, Taipei City (TW)

( * ) Notice: Subject to any disclaimer, the term of this patent is extended or adjusted under 35 U.S.C. 154(b) by 0 days.

(21) Appl. No.: 18/884,055

(22) Filed: Sep. 12, 2024

(65) Prior Publication Data

US 2025/0007456 A1　　Jan. 2, 2025

Related U.S. Application Data

(63) Continuation-in-part of application No. 18/083,589, filed on Dec. 19, 2022, now Pat. No. 12,117,865.

(51) Int. Cl.
| | |
|---|---|
| *H03B 5/04* | (2006.01) |
| *G06F 1/08* | (2006.01) |
| *G06F 1/12* | (2006.01) |
| *H03B 5/32* | (2006.01) |

(52) U.S. Cl.
CPC ................. *H03B 5/04* (2013.01); *G06F 1/08* (2013.01); *G06F 1/12* (2013.01); *H03B 5/32* (2013.01)

(58) Field of Classification Search
CPC .... G06F 1/08; G06F 1/12; H03B 5/04; H03B 5/32
USPC ................. 331/16, 154, 34, 177 R, 158, 176
See application file for complete search history.

(56) References Cited

U.S. PATENT DOCUMENTS

2017/0194968 A1 * 7/2017 Yonezawa ............. H03L 7/0991

* cited by examiner

*Primary Examiner* — Arnold M Kinkead
(74) *Attorney, Agent, or Firm* — JCIPRNET

(57)　　　　　ABSTRACT

A frequency generating device and an operation method thereof are provided. The frequency generating device includes an oscillator circuit and a processor circuit. The oscillator circuit generates a clock signal and adjust a clock frequency of the clock signal according to a control voltage generated by the processor circuit. The processor circuit calculates a current frequency aging rate value based on a current clock frequency. The processor circuit calculates a control voltage regulation rate value based on the current frequency aging rate value and a control voltage slope, and compensates the control voltage based on the control voltage regulation rate value in the holdover state. Alternatively, the processor circuit calculates a frequency regulation value based on the current frequency aging rate value and an oscillator resolution of the synchronizer, and provides the frequency regulation value to the synchronizer in the holdover state to compensate an output frequency of the synchronizer.

23 Claims, 28 Drawing Sheets

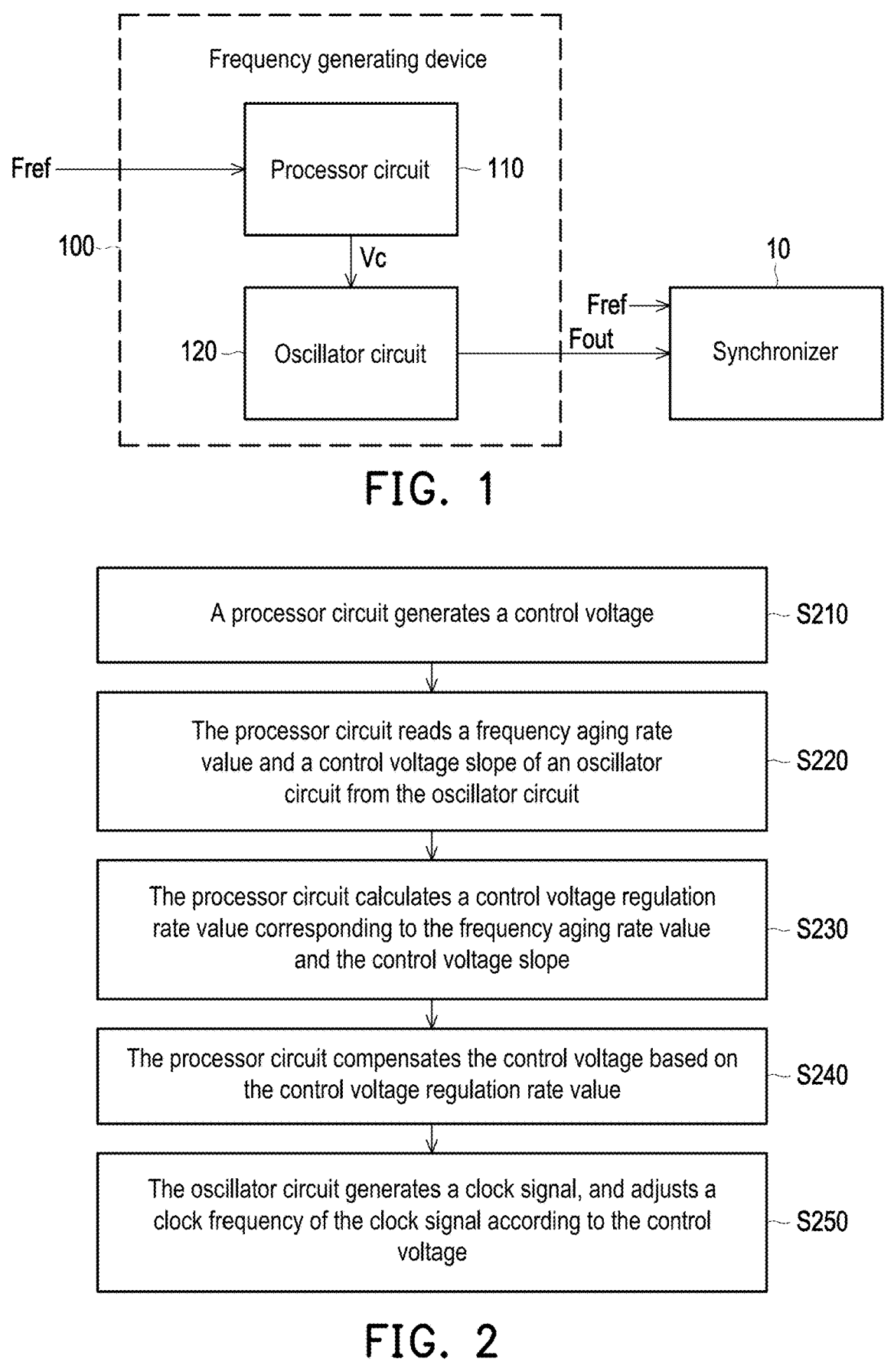

Frequency generating device

Fref →

Processor circuit ~ 110

100 ~

Vc

120 ~ Oscillator circuit

Fref →
Fout →

10

Synchronizer

FIG. 1

| | |
|---|---|
| A processor circuit generates a control voltage | ~ S210 |
| The processor circuit reads a frequency aging rate value and a control voltage slope of an oscillator circuit from the oscillator circuit | ~ S220 |
| The processor circuit calculates a control voltage regulation rate value corresponding to the frequency aging rate value and the control voltage slope | ~ S230 |
| The processor circuit compensates the control voltage based on the control voltage regulation rate value | ~ S240 |
| The oscillator circuit generates a clock signal, and adjusts a clock frequency of the clock signal according to the control voltage | ~ S250 |

FIG. 2

Control voltage Vc

Elapsed time

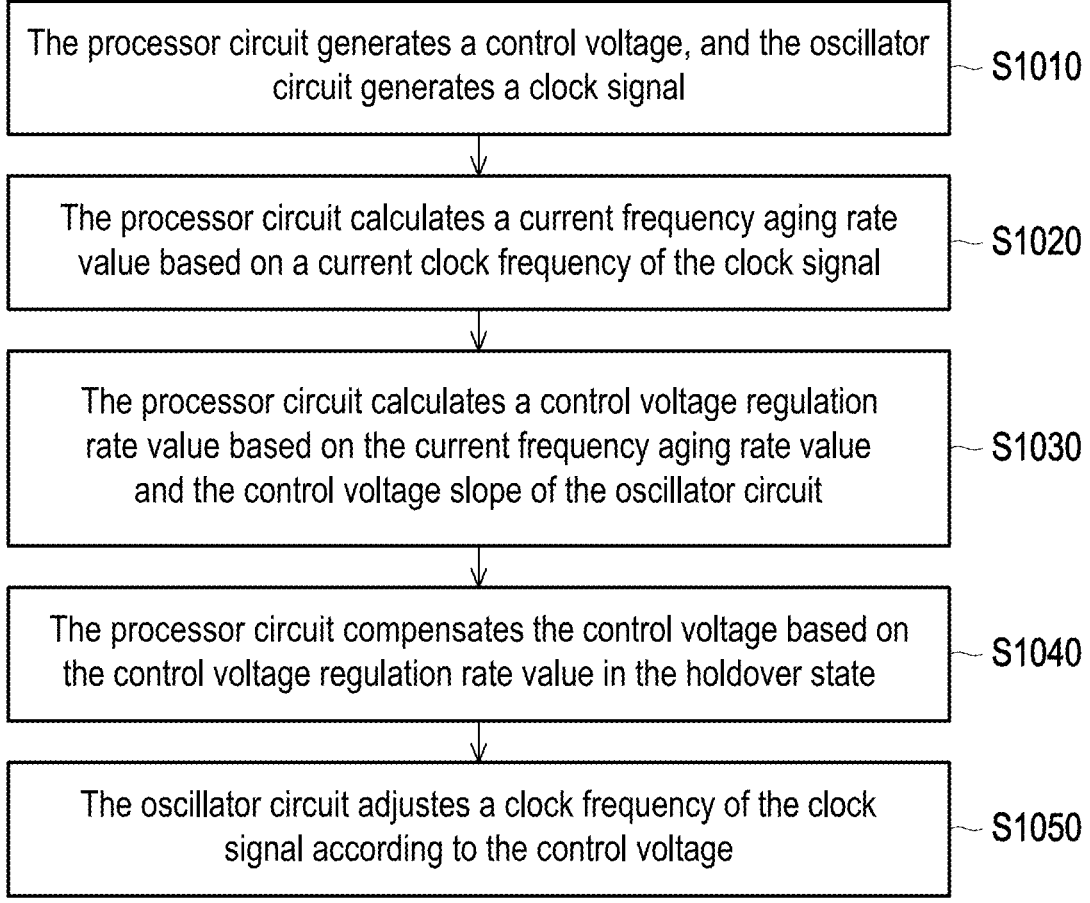

The processor circuit generates a control voltage, and the oscillator circuit generates a clock signal — S1010

The processor circuit calculates a current frequency aging rate value based on a current clock frequency of the clock signal — S1020

The processor circuit calculates a control voltage regulation rate value based on the current frequency aging rate value and the control voltage slope of the oscillator circuit — S1030

The processor circuit compensates the control voltage based on the control voltage regulation rate value in the holdover state — S1040

The oscillator circuit adjustes a clock frequency of the clock signal according to the control voltage — S1050

FIG. 10

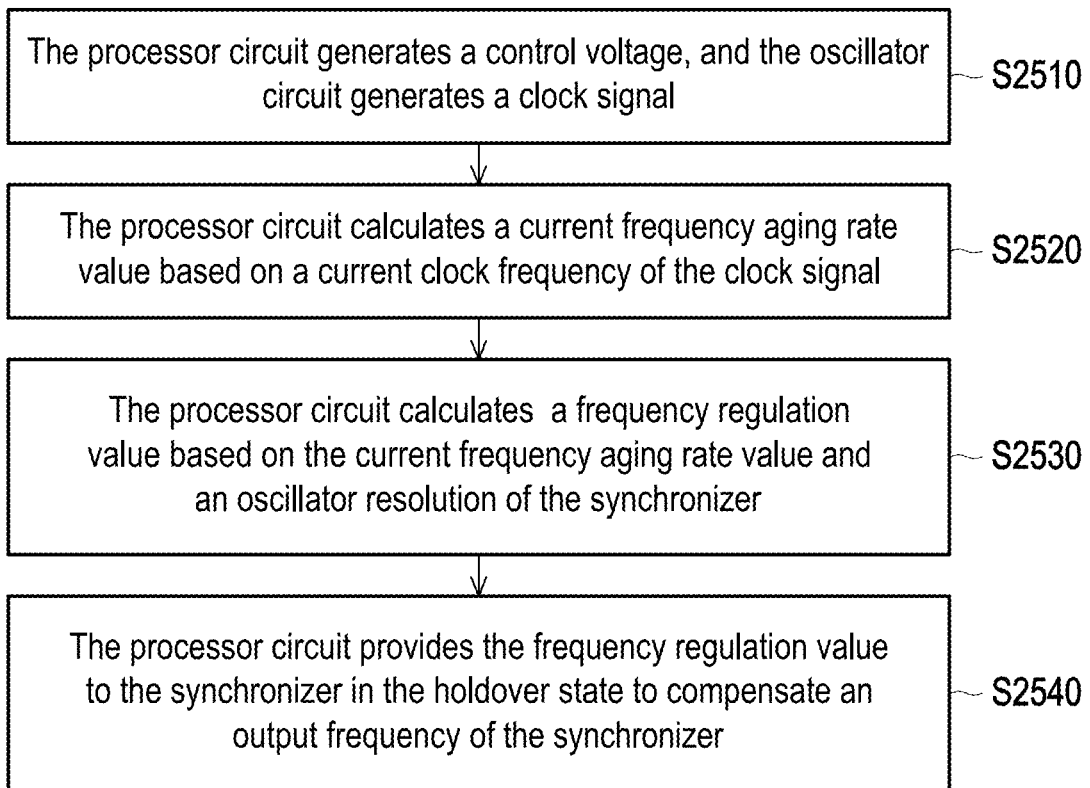

The processor circuit generates a control voltage, and the oscillator circuit generates a clock signal — S2510

The processor circuit calculates a current frequency aging rate value based on a current clock frequency of the clock signal — S2520

The processor circuit calculates a frequency regulation value based on the current frequency aging rate value and an oscillator resolution of the synchronizer — S2530

The processor circuit provides the frequency regulation value to the synchronizer in the holdover state to compensate an output frequency of the synchronizer — S2540

FIG. 25

FREQUENCY GENERATING DEVICE AND OPERATION METHOD THEREOF

CROSS-REFERENCE TO RELATED APPLICATION

This application is a continuation-in-part application of and claims the priority benefit of U.S. application Ser. No. 18/083,589, filed on Dec. 19, 2022, and issued as U.S. Pat. No. 12,117,865 on Oct. 15, 2024. The entirety of the above-mentioned patent application is hereby incorporated by reference herein and made a part of this specification.

BACKGROUND

Technical Field

The disclosure relates to an electronic circuit, and more particularly to a frequency generating device and an operation method thereof.

Description of Related Art

The oscillator circuit such as a temperature compensated crystal oscillator (TCXO) and an oven controlled crystal oscillator (OCXO) play an important role in synchronization network applications. A phase locked loop (PLL) may lock an oscillation frequency of the TCXO or the OCXO according to a global navigation satellite system (GNSS) signal or other external reference clock signals to meet synchronization requirements of the synchronization network applications. The case where the oscillation frequency of the TCXO or the OCXO is locked by the GNSS signal or other external reference clock signals is referred to as a disciplined state.

In the case where the external reference clock signal (for example, the GNSS signal) is lost, the oscillation frequency of the TCXO or the OCXO enters a so-called holdover state. In the holdover state, the role of the local TCXO or OCXO is to ensure that the synchronization process still meets network requirements of frequency stability based on temperature, time (aging), etc. However, the oscillation frequencies of the TCXO and the OCXO may change over time, which is commonly referred to as aging. Such aging effect results in a shorter holdover time. Frequency aging of the TCXO and the OCXO is inevitable. How to still ensure that the holdover time in the holdover state can meet the synchronization requirements of the synchronization network applications in the case where the TCXO (or the OCXO) is aging is one of many technical issues in the art.

SUMMARY

The disclosure provides a frequency generating device and an operation method thereof, so as to perform frequency aging compensation for a clock signal generated by an oscillator circuit and an output frequency of a synchronizer.

In an embodiment of the disclosure, the frequency generating device includes an oscillator circuit and a processor circuit. The oscillator circuit is configured to generate a clock signal to a synchronizer and adjust a clock frequency of the clock signal according to a control voltage. The processor circuit is coupled to the oscillator circuit and is configured to generate the control voltage. The processor circuit calculates a current frequency aging rate value of the oscillator circuit based on a current clock frequency of the clock signal, wherein the current frequency aging rate value is related to a current frequency change rate of the clock signal before entering a holdover state; the processor circuit calculates a control voltage regulation rate value based on the current frequency aging rate value and a control voltage slope of the oscillator circuit, wherein the control voltage slope represents a slope of a relationship curve of the control voltage to the clock frequency; and the processor circuit compensate the control voltage based on the control voltage regulation rate value in the holdover state. Alternatively, the processor circuit calculates the current frequency aging rate value of the oscillator circuit based on the current clock frequency of the clock signal; the processor circuit calculates a frequency regulation value based on the current frequency aging rate value and an oscillator resolution of the synchronizer; the oscillator resolution represents a frequency regulation granularity of an oscillator in the synchronizer; and the processor circuit provides the frequency regulation value to the synchronizer in the holdover state to compensate an output frequency of the synchronizer.

In an embodiment of the disclosure, the operation method includes the following steps. A control voltage is generated by a processor circuit of a frequency generating device, and a clock signal is generated by an oscillator circuit of the frequency generating device. A current frequency aging rate value of the oscillator circuit is calculated by the processor circuit based on a current clock frequency of the clock signal, wherein the current frequency aging rate value is related to a current frequency change rate of the clock signal before entering a holdover state. A control voltage regulation rate value is calculated by the processor circuit based on the current frequency aging rate value and a control voltage slope of the oscillator circuit, wherein the control voltage slope represents a slope of a relationship curve of the control voltage to the clock frequency. The control voltage is compensated by the processor circuit based on the control voltage regulation rate value in the holdover state. A clock frequency of the clock signal is adjusted by the oscillator circuit according to the control voltage.

In an embodiment of the disclosure, the operation method includes the following steps. A control voltage is generated by a processor circuit of a frequency generating device to an oscillator circuit of the frequency generating device, and a clock signal is generated by the oscillator circuit to a synchronizer. A current frequency aging rate value of the oscillator circuit is calculated by the processor circuit based on a current clock frequency of the clock signal, wherein the current frequency aging rate value is related to a current frequency change rate of the clock signal before entering a holdover state. A frequency regulation value is calculated by the processor circuit based on the current frequency aging rate value and an oscillator resolution of the synchronizer, wherein the oscillator resolution represents a frequency regulation granularity of an oscillator in the synchronizer. The frequency regulation value is provided by the processor circuit to the synchronizer in the holdover state to compensate an output frequency of the synchronizer.

Based on the above, in some embodiments of the disclosure, the processor circuit may calculate the current frequency aging rate value based on the current clock frequency, and calculate the control voltage regulation rate value applicable to the oscillator circuit based on the current frequency aging rate value and the control voltage slope, and then compensate the control voltage applied to the oscillator circuit based on the control voltage regulation rate value, so as to perform frequency aging compensation. Alternatively, in other embodiments of the disclosure, the processor circuit calculates a frequency regulation value based on the current frequency aging rate value and the oscillator resolution of the synchronizer, and provides the frequency regulation value to the synchronizer in the holdover state to compensate an output frequency of the synchronizer, so as to perform frequency aging compensation.

In order for the features and advantages of the disclosure to be more comprehensible, the following specific embodiments are described in detail in conjunction with the drawings.

BRIEF DESCRIPTION OF THE DRAWINGS

FIG. 1 is a schematic diagram of a circuit block of a frequency generating device according to an embodiment of the disclosure.

FIG. 2 is a schematic flowchart of an operation method of a frequency generating device according to an embodiment of the disclosure.

FIG. 10 is a schematic flowchart of an operation method of a frequency generating device according to another embodiment of the disclosure.

FIG. 25 is a schematic flowchart of an operation method of a frequency generating device according to another embodiment of the disclosure.

DETAILED DESCRIPTION OF DISCLOSED EMBODIMENTS

Figure 3:
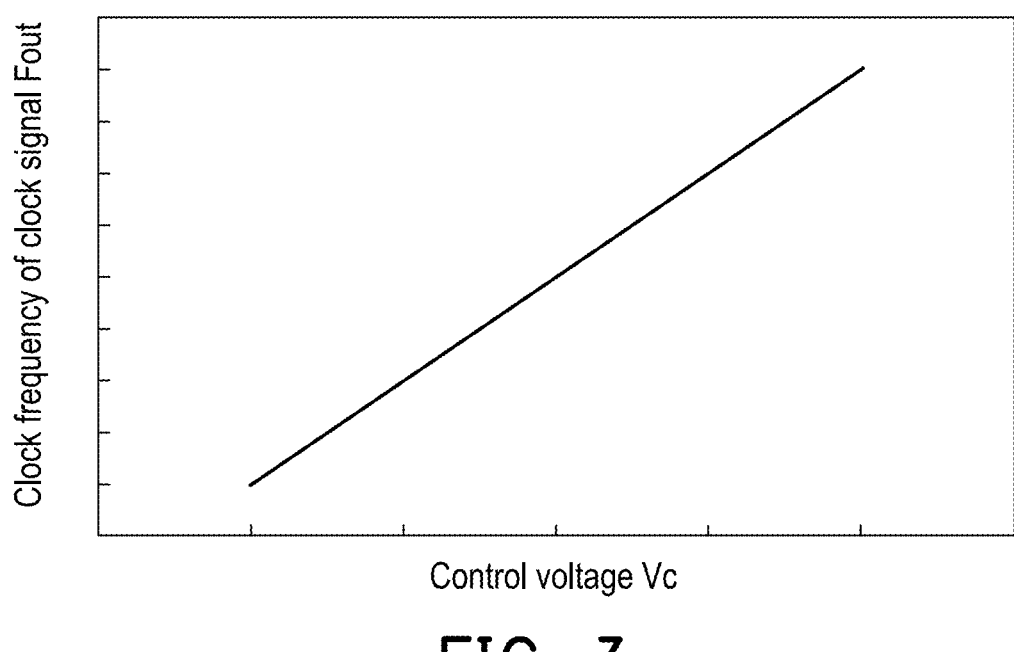
FIG. 3 is a schematic diagram of a relationship curve of a control voltage to a clock frequency of a clock signal according to an embodiment of the disclosure.

The term "coupling (or connection)" used in the entire specification (including the claims) of the disclosure may refer to any direct or indirect connection means. For example, if a first device is described as being coupled (or connected) to a second device, it should be interpreted that the first device may be directly connected to the second device or the first device may be indirectly connected to the second device through another device or certain connection means. Terms such as "first" and "second" mentioned in the entire specification (including the claims) of the disclosure are used to name the elements or to distinguish between different embodiments or ranges, but not to limit the upper limit or the lower limit of the number of elements or to limit the sequence of the elements. In addition, wherever possible, elements/components/steps using the same reference numerals in the drawings and embodiments represent the same or similar parts. Related descriptions of the elements/components/steps using the same reference numerals or using the same terminologies in different embodiments may be cross-referenced.

FIG. 1 is a schematic diagram of a circuit block of a frequency generating device 100 according to an embodiment of the disclosure. In a disciplined state, that is, in the case where an external reference clock signal Fref is not lost, the frequency generating device 100 may generate a clock signal Fout for a synchronizer 10 based on the external reference clock signal Fref. According to the actual design, in some embodiments, the synchronizer 10 may include a phase locked loop (PLL) and/or other synchronization circuits. The synchronizer 10 may lock an oscillation frequency of the clock signal Fout of the frequency generating device 100 according to the external reference clock signal Fref to meet synchronization requirements of synchronization network applications. Based on different application environments, the external reference clock signal Fref may include a global navigation satellite system (GNSS) signal, a precision time protocol (PTP) signal defined by IEEE 1588, a synchronous ethernet (SyncE) signal, or other synchronization signals.

In the actual application scenario, a clock frequency of the external reference clock signal Fref may be abnormal. The meaning of the so-called abnormal includes the external reference clock signal Fref (for example, the GNSS signal) being lost. For example, the frequency generating device 100 may receive the clock frequency of the external reference clock signal Fref, and then compare the clock frequency of the external reference clock signal Fref with a certain set frequency to judge whether the clock frequency of the external reference clock signal Fref is abnormal. The set frequency may be determined according to the actual design and/or application requirements. For example, the set frequency is a clock frequency based on the external reference clock signal Fref.

When the external reference clock signal Fref is lost, the synchronizer 10 may continuously perform synchronization by relying on the clock signal Fout generated by the local oscillator (the frequency generating device 100). Such state is referred to as a "holdover state". Ideally, the clock signal Fout of the frequency generating device 100 still meets network requirements such as frequency stability in the holdover state. In practice, however, the oscillation frequency of the clock signal Fout may change over time without any compensation operation, which is commonly referred to as frequency aging. The following embodiments will illustrate how to perform aging compensation on the oscillation frequency of the clock signal Fout in the case where the oscillator is aging.

FIG. 2 is a schematic flowchart of an operation method of a frequency generating device according to an embodiment of the disclosure. Please refer to FIG. 1 and FIG. 2. The frequency generating device 100 includes a processor circuit 110 and an oscillator circuit 120. The processor circuit 110 is coupled to the oscillator circuit 120. In Step S210, the processor circuit 110 may generate a control voltage Vc to the oscillator circuit 120. In Step S220, the processor circuit 110 may read a frequency aging rate value Rfa and a control voltage slope Svc of the oscillator circuit 120 from the oscillator circuit 120. The frequency aging rate value Rfa is related to a predicted frequency change rate of the clock signal Fout at a certain expected time point, and the control voltage slope Svc represents a slope of a relationship curve of the control voltage Vc to the clock frequency of the clock signal Fout.

FIG. 3 is a schematic diagram of a relationship curve of the control voltage Vc to the clock frequency of the clock signal Fout according to an embodiment of the disclosure. The horizontal axis of FIG. 3 represents the control voltage Vc, and the vertical axis represents the clock frequency of the clock signal Fout. A testing platform may measure the oscillator circuit 120 to plot the relationship curve of the control voltage Vc to the clock frequency of the clock signal Fout shown in FIG. 3, and then pre-write the slope (the control voltage slope Svc) of the relationship curve into a non-volatile memory inside the oscillator circuit 120.

The frequency aging rate value Rfa of the oscillator circuit 120 is related to the predicted frequency change rate of the clock signal Fout at a certain expected time point. The expected time point may be determined according to the actual design and/or the application requirements. For example (but not limited to), the frequency aging rate value Rfa may include the predicted frequency change rate of the clock signal Fout on the 3500-th day.

Figure 4:
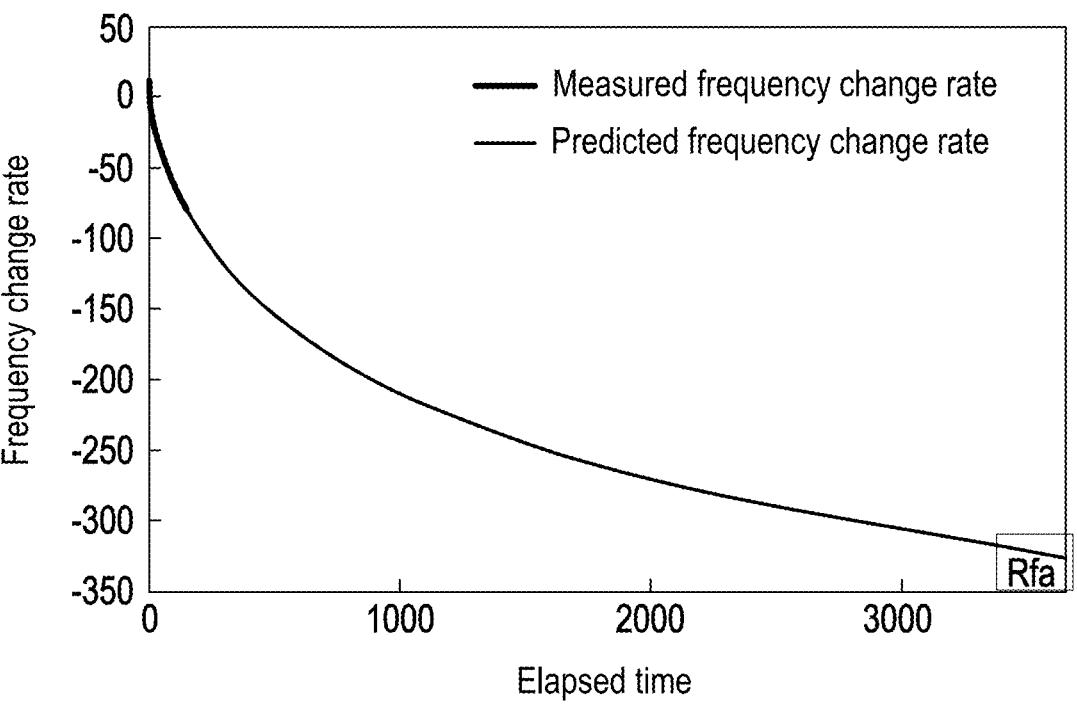
FIG. 4 is a schematic diagram of a frequency aging curve of an oscillator circuit according to an embodiment of the disclosure.

FIG. 4 is a schematic diagram of a frequency aging curve of the oscillator circuit 120 according to an embodiment of the disclosure. The horizontal axis of FIG. 4 represents elapsed time in the unit of days. The vertical axis of FIG. 4 represents a change amount (a frequency change rate) of the clock frequency of the clock signal Fout in the unit of ppb. The testing platform may measure the frequency of the clock signal Fout of the oscillator circuit 120 multiple times over a period of time (for example, days or weeks) to calculate a measured frequency change rate (for example, the thick line shown in the upper left part of the curve shown in FIG. 4 is the measured frequency change rate) of the clock signal Fout at different time points. For example, in some embodiments, the testing platform may calculate a difference value between two frequencies measured at any two adjacent time points as the measured frequency change rate. Alternatively, in other embodiments, the testing platform may perform differential calculation on multiple frequencies measured at different time points, and then use a differential calculation result (multiple differential values) as the measured frequency change rate.

Next, the testing platform may predict multiple predicted frequency change rates (for example, the thin line shown in the remaining part of the curve except the upper left part shown in FIG. 4 is the predicted frequency change rate) of the clock signal Fout at different time points by using a prediction model and the measured frequency change rates. In some embodiments, the predicted frequency change rates may be regarded as the differential values of the clock frequency of the clock signal Fout at different time points. In some embodiments, the testing platform may predict a predicted frequency change rate of the clock signal Fout at a certain expected time point by using the prediction model and the measured frequency change rates, and then use the predicted frequency change rate as the frequency aging rate value Rfa. The expected time point may be determined according to the actual design and/or the application requirements. For example (but not limited to), the frequency aging rate value Rfa may include the predicted frequency change rate of the clock signal Fout on the 3500-th day. The testing platform may pre-write the predicted frequency change rate of the oscillator circuit 120 into the non-volatile memory inside the oscillator circuit 120.

Please refer to FIG. 1 and FIG. 2. In Step S230, the processor circuit 110 may calculate a control voltage regulation rate value Rreg corresponding to the frequency aging rate value Rfa and the control voltage slope Svc. For example, the processor circuit 110 may calculate a quotient of the frequency aging rate value Rfa and the control voltage slope Svc as the control voltage regulation rate value Rreg, that is, $Rreg=Rfa/Svc$.

Figure 5:
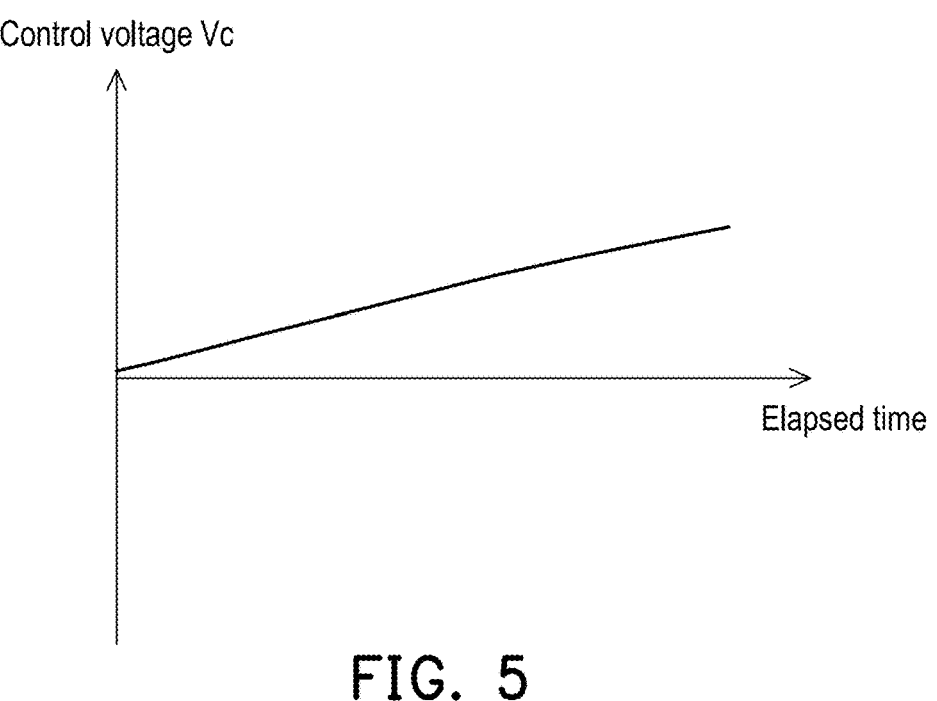
FIG. 5 is a schematic diagram of a control voltage regulation rate value curve of an oscillator circuit according to an embodiment of the disclosure.

FIG. 5 is a schematic diagram of a control voltage regulation rate value curve of the oscillator circuit 120 according to an embodiment of the disclosure. The horizontal axis of FIG. 5 represents elapsed time. The vertical axis of FIG. 5 represents the control voltage Vc. The predicted frequency change rates at different time points in the frequency aging curve shown in FIG. 4 are respectively divided by the clock frequencies of different control voltages Vc shown in FIG. 3 to obtain multiple control voltage regulation rate values, thereby plotting the control voltage regulation rate value curve shown in FIG. 5 according to the control voltage regulation rate values.

Please refer to FIG. 1 and FIG. 2. In Step S240, the processor circuit 110 may compensate the control voltage Vc based on the control voltage regulation rate value Rreg. In addition, the processor circuit 110 may receive the clock frequency of the external reference clock signal Fref, and then compare the clock frequency of the external reference clock signal Fref with a certain set frequency to judge whether the clock frequency of the external reference clock signal Fref is abnormal. The set frequency may be determined according to the actual design and/or the application requirements. For example, the set frequency is a clock frequency based on the external reference clock signal Fref.

In Step S250, the oscillator circuit 120 may generate the clock signal Fout, and the oscillator circuit 120 adjusts the clock frequency of the clock signal Fout according to the control voltage Vc. The processor circuit 110 may record a current voltage level of the control voltage Vc before the oscillator circuit 120 is powered down. After the oscillator circuit 120 is powered back on, the processor circuit 110 uses the pre-stored current voltage level as an initial control voltage level.

Based on the above, the oscillator circuit 120 stores its own frequency aging rate value Rfa and control voltage slope Svc. The processor circuit 110 may calculate the control voltage regulation rate value Rreg applicable to the oscillator circuit 120 based on the frequency aging rate value Rfa and the control voltage slope Svc provided by the oscillator circuit 120, and then compensate the control voltage Vc applied to the oscillator circuit 120 based on the control voltage regulation rate value Rreg, so as to perform frequency aging compensation.

According to different design requirements, in some embodiments, the implementation of the processor circuit 110 may be a hardware circuit. In other embodiments, the implementation of the processor circuit 110 may be in the form of firmware, software (that is, a program), or a combination of the two. In still other embodiments, the implementation of the processor circuit 110 may be in the form of a combination of hardware, firmware, and software.

In terms of the form of hardware, the processor circuit 110 may be implemented as a logic circuit in an integrated circuit. For example, related functions of the processor circuit 110 may be implemented in one or more controllers, microcontrollers, microprocessors, application-specific integrated circuits (ASICs), digital signal processors (DSPs), field programmable gate arrays (FPGAs), and/or various logic blocks, modules, and circuits in other processing units. The related functions of the processor circuit 110 may be implemented as a hardware circuit, such as various logic blocks, modules, and circuits in an integrated circuit, by using hardware description languages (for example, Verilog HDL or VHDL) or other suitable programming languages.

In terms of the form of software and/or firmware, the related functions of the processor circuit 110 may be implemented as programming codes. For example, the processor circuit 110 is implemented by using general programming languages (for example, C, C++, or assembly languages) or other suitable programming languages. The programming codes may be recorded/stored into a "non-transitory computer readable medium". In some embodiments, the non-transitory computer readable medium includes, for example, a semiconductor memory and/or a storage device. The semiconductor memory includes a memory card, a read only memory (ROM), a flash memory, a programmable logic circuit, or other semiconductor memories. The storage device includes a tape, a disk, a hard disk drive (HDD), a solid-state drive (SSD), or other storage devices. An electronic equipment (for example, a computer, a central processing unit (CPU), a controller, a microcontroller, or a microprocessor) may read and execute the programming codes from the non-transitory computer readable medium, thereby implementing the related functions of the processor circuit 110. Alternatively, the programming codes may be provided to the electronic equipment via any transmission medium (for example, a communication network, a broadcast wave, etc.). The communication network is, for example, the Internet, a wired communication network, a wireless communication network, or other communication media.

Figure 6:
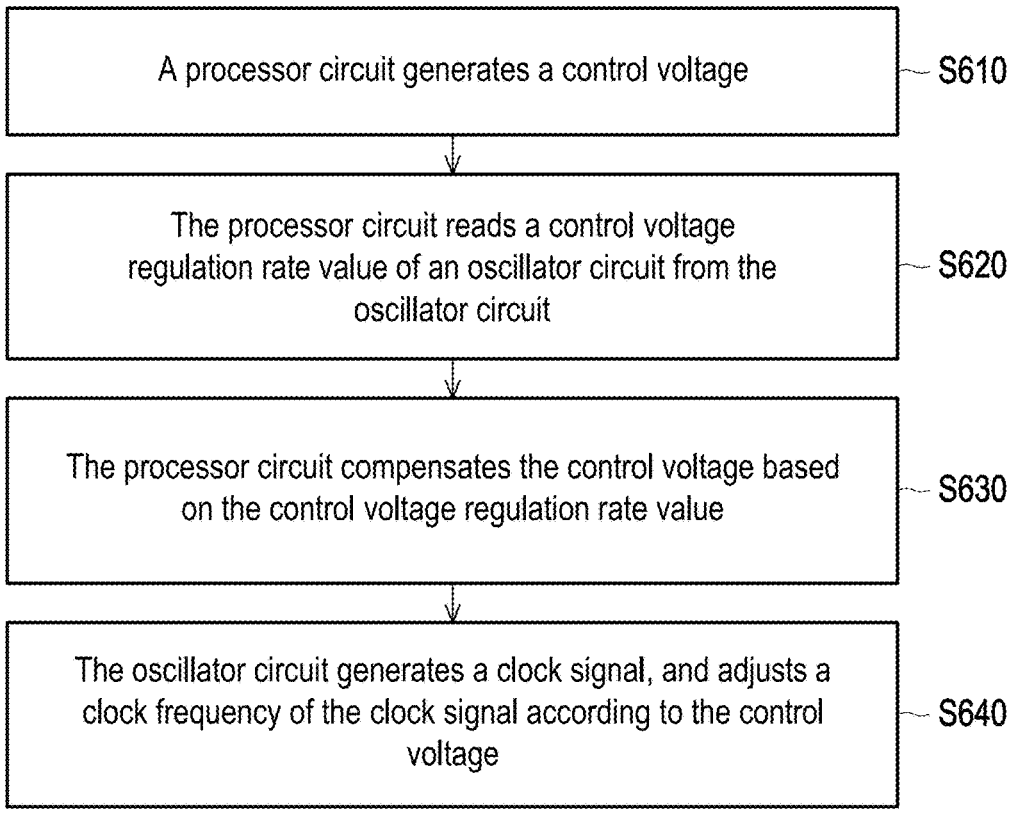
FIG. 6 is a schematic flowchart of an operation method of a frequency generating device according to another embodiment of the disclosure.

FIG. 6 is a schematic flowchart of an operation method of a frequency generating device according to another embodiment of the disclosure. Please refer to FIG. 1 and FIG. 6. In Step S610, the processor circuit 110 may generate the control voltage Vc to the oscillator circuit 120. In Step S620, the processor circuit 110 may read the control voltage regulation rate value Rreg of the oscillator circuit 120 from the oscillator circuit 120. In Step S630, the processor circuit 110 may compensate the control voltage Vc based on the control voltage regulation rate value Rreg. In Step S640, the oscillator circuit 120 may generate the clock signal Fout, and the oscillator circuit 120 may adjust the clock frequency of the clock signal Fout according to the control voltage Vc. Steps S610, S620, S630, and S640 shown in FIG. 6 may be analogized with reference to the related description of Steps S210, S240, and S250 shown in FIG. 2, so there will be no repetition. The processor circuit 110 may record the current voltage level of the control voltage Vc before the oscillator circuit 120 is powered down. After the oscillator circuit 120 is powered back on, the processor circuit 110 uses the pre-stored current voltage level as the initial control voltage level.

Based on the above, the oscillator circuit 120 stores the control voltage regulation rate value Rreg associated with its own frequency aging rate value Rfa. The processor circuit 110 may compensate the control voltage Vc applied to the oscillator circuit 120 based on the control voltage regulation rate value Rreg provided by the oscillator circuit 120, so as to perform frequency aging compensation.

Figure 7:
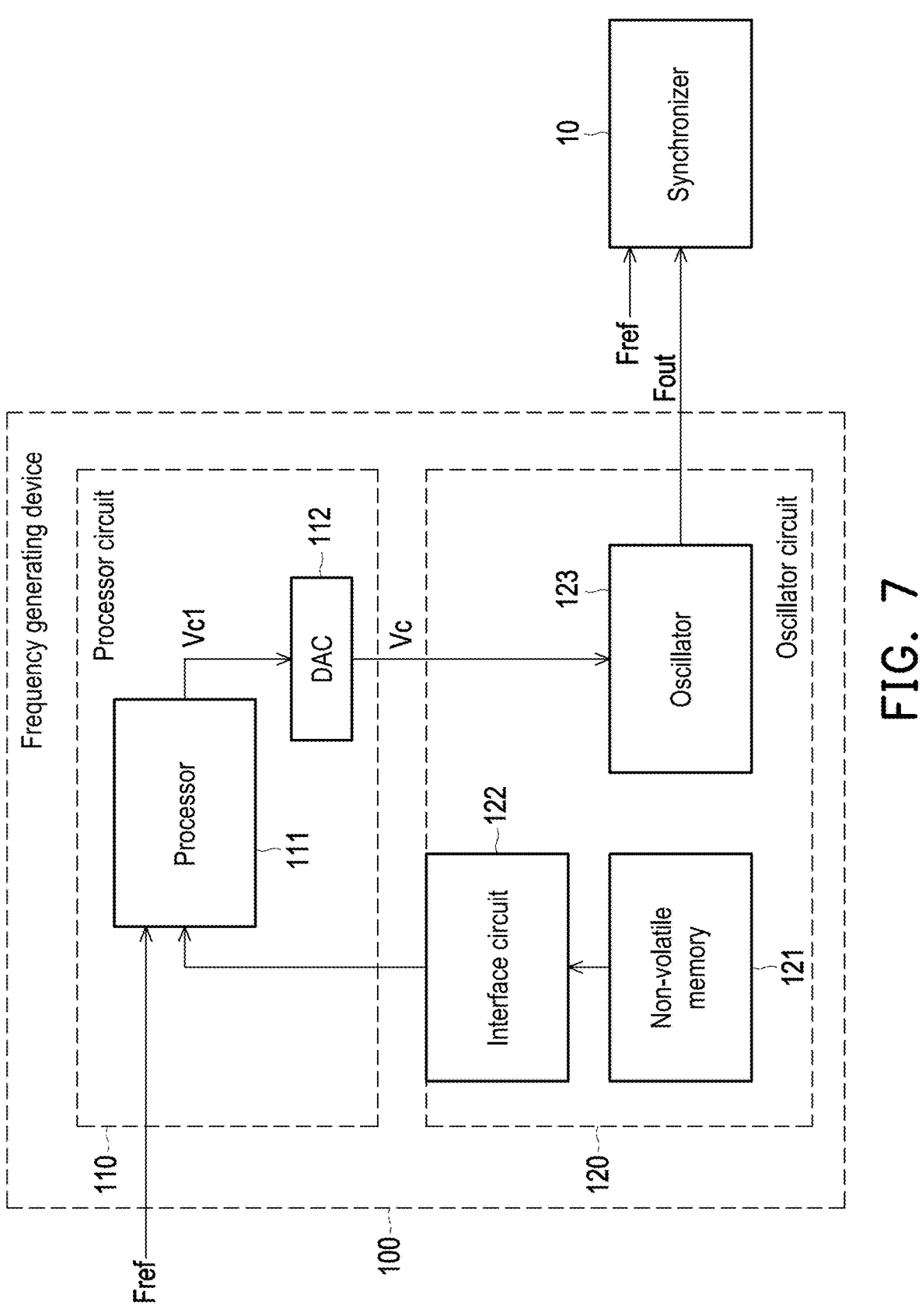
FIG. 7 is a schematic diagram of a circuit block of a processor circuit and an oscillator circuit according to an embodiment of the disclosure.

FIG. 7 is a schematic diagram of a circuit block of the processor circuit 110 and the oscillator circuit 120 according to an embodiment of the disclosure. For the synchronizer 10, the frequency generating device 100, the processor circuit 110, and the oscillator circuit 120 shown in FIG. 7, reference may be made to the related description of FIG. 1, so there will be no repetition. In the embodiment shown in FIG. 7, the oscillator circuit 120 includes a non-volatile memory 121, an interface circuit 122, and an oscillator 123. According to the actual design and/or the application requirements, the oscillator 123 may be a crystal oscillator, a surface acoustic wave (SAW) oscillator, a microelectromechanical systems (MEMS) oscillator, or other oscillators. The oscillator 123 may include a voltage controlled crystal oscillator (VCXO), a temperature compensated crystal oscillator (TCXO), an oven controlled crystal oscillator (OCXO), or other oscillators.

In some embodiments, the non-volatile memory 121 may provide the frequency aging rate value Rfa and the control voltage slope Svc of the oscillator 123. The interface circuit 122 is coupled to the non-volatile memory 121. The interface circuit 122 may read the frequency aging rate value Rfa and the control voltage slope Svc from the non-volatile memory 121, and provide the frequency aging rate value Rfa and the control voltage slope Svc of the oscillator 123 to the processor circuit 110. In other embodiments, the non-volatile memory 121 may provide the control voltage regulation rate value Rreg of the oscillator 123. The interface circuit 122 may read the control voltage regulation rate value Rreg from the non-volatile memory 121, and provide the control voltage regulation rate value Rreg of the oscillator 123 to the processor circuit 110. The oscillator 123 is coupled to the processor circuit 110 to receive the control voltage Vc. The oscillator 123 may generate the clock signal Fout according to the control voltage Vc.

In the embodiment shown in FIG. 7, the processor circuit 110 includes a processor 111 and a digital to analog converter (DAC) 112. The processor circuit 110 may receive the clock frequency of the external reference clock signal Fref, and then compare the clock frequency of the external reference clock signal Fref with a certain set frequency to judge whether the clock frequency of the external reference clock signal Fref is abnormal. The set frequency may be determined according to the actual design and/or the application requirements. For example, the set frequency is a clock frequency based on the external reference clock signal Fref.

The processor 111 is coupled to the oscillator circuit 120. In some embodiments, the processor 111 may read the frequency aging rate value Rfa and the control voltage slope Svc of the oscillator 123 from the oscillator circuit 120, and the processor 111 may then calculate the quotient of the frequency aging rate value Rfa and the control voltage slope Svc as the control voltage regulation rate value Rreg of the oscillator 123. In other embodiments, the processor 111 may read the control voltage regulation rate value Rreg of the oscillator 123 from the oscillator circuit 120. The processor 111 may compensate a control value Vc1 by using the control voltage regulation rate value Rreg of the oscillator 123.

The digital to analog converter 112 is coupled to the processor 111 to receive the control value Vc1. The digital to analog converter 112 may convert the control value Vc1 into the control voltage Vc for the oscillator circuit 120. Based on the above, the digital to analog converter 112 may provide the compensated control voltage Vc to the oscillator 123, so as to perform frequency aging compensation on the clock frequency of the clock signal Fout.

Figure 8:
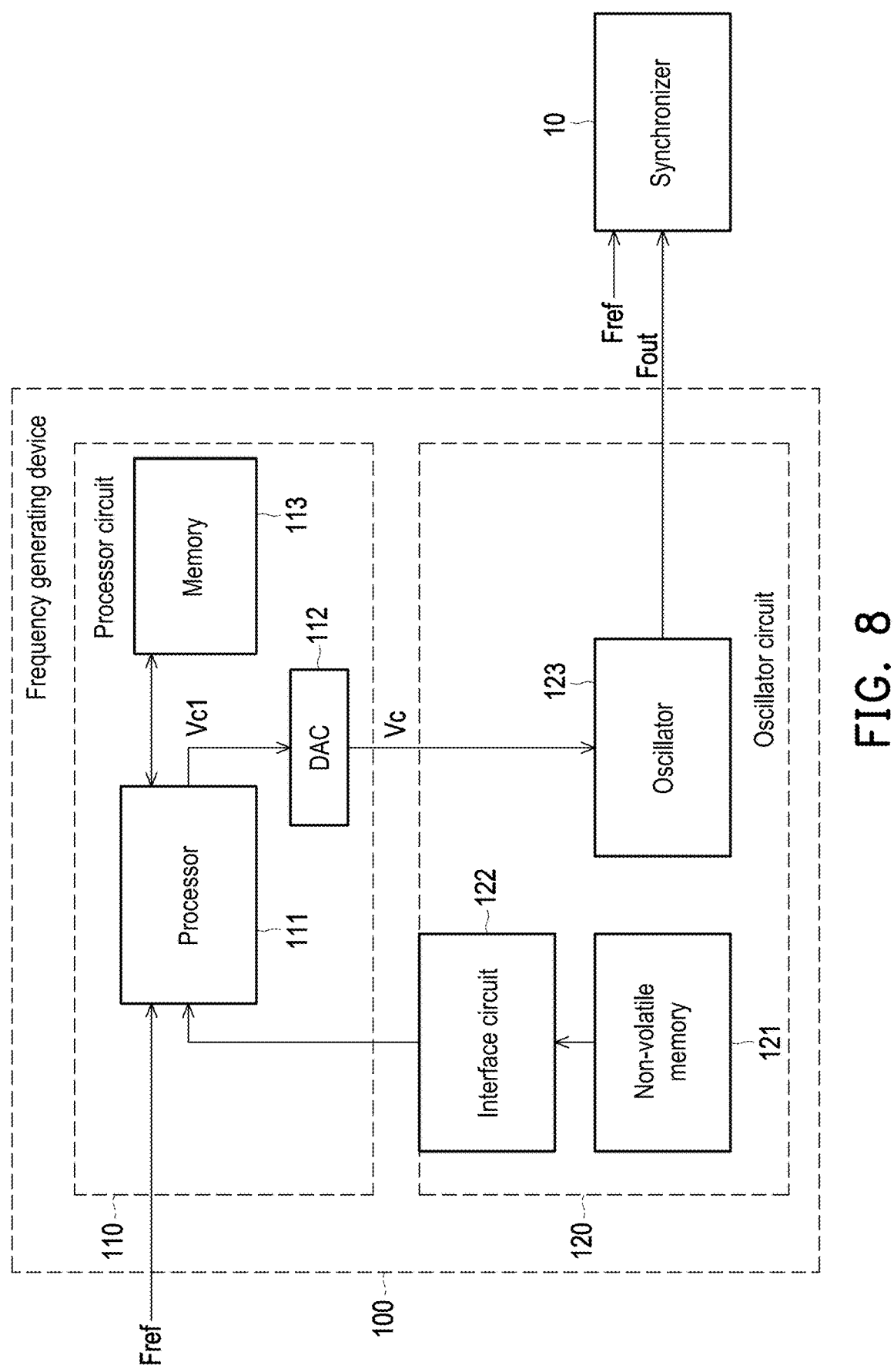
FIG. 8 is a schematic diagram of a circuit block of a processor circuit according to another embodiment of the disclosure.

FIG. 8 is a schematic diagram of a circuit block of the processor circuit 110 according to another embodiment of the disclosure. For the synchronizer 10, the frequency generating device 100, the processor circuit 110, and the oscillator circuit 120 shown in FIG. 8, reference may be made to the related description of FIG. 1, and for the oscillator circuit 120 shown in FIG. 8, reference may be made to the related description of the oscillator circuit 120 shown in FIG. 7, so there will be no repetition. In the embodiment shown in FIG. 8, the processor circuit 110 includes the processor 111, the digital to analog converter (DAC) 112, and a memory 113. For the processor 111 and the digital to analog converter 112 shown in FIG. 8, reference may be made to the related description of the processor 111 and the digital to analog converter 112 shown in FIG. 7, so there will be no repetition.

In the embodiment shown in FIG. 8, the memory 113 is coupled to the processor 111. The processor 111 may record the current voltage level of the control voltage Vc before the oscillator circuit 120 is powered down into the memory 113. After the oscillator circuit 120 is powered back on, the processor 111 may use the current voltage level recorded in the memory 113 as the initial control voltage level.

Figure 9:
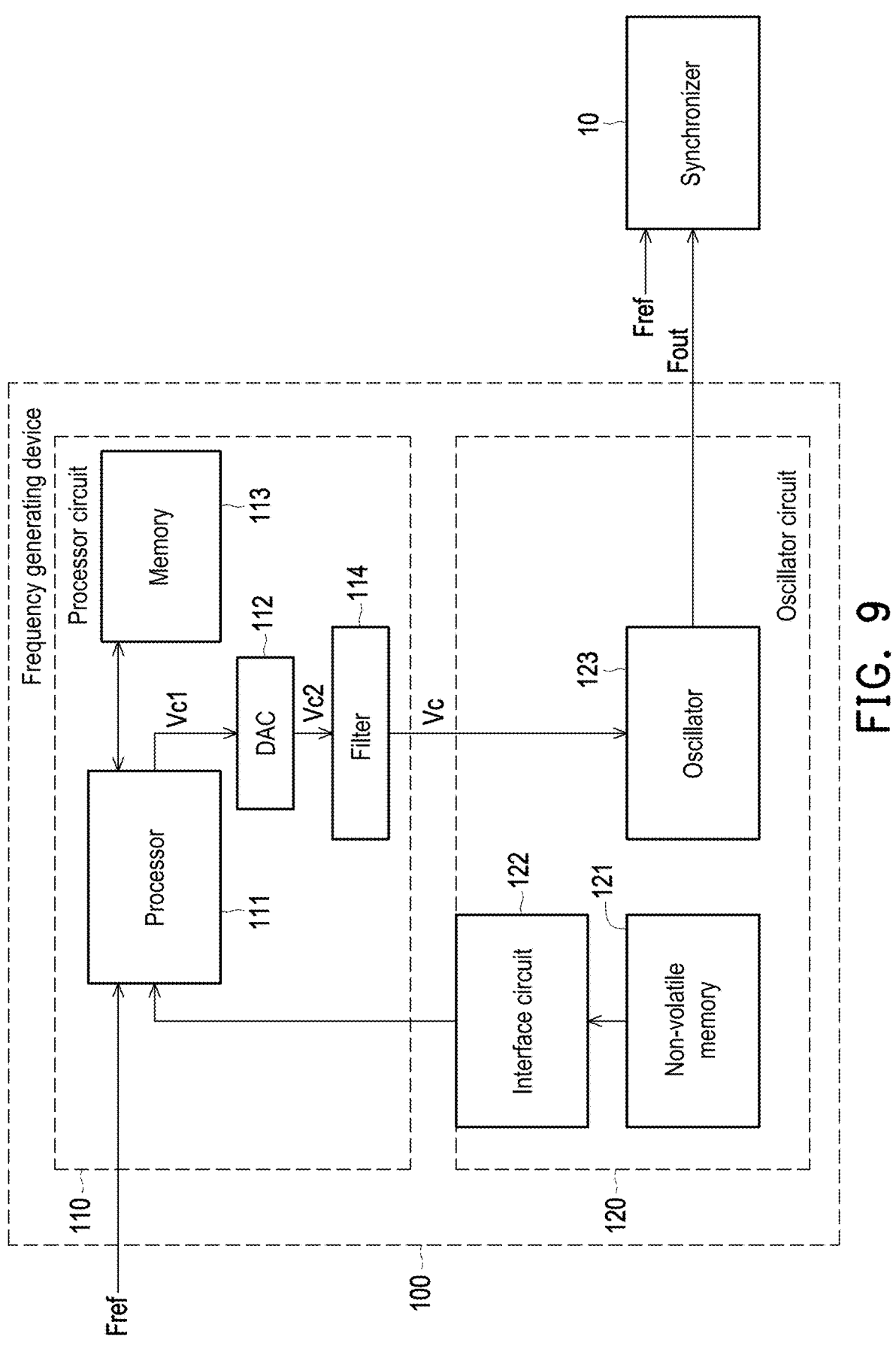
FIG. 9 is a schematic diagram of a circuit block of a processor circuit according to still another embodiment of the disclosure.

FIG. 9 is a schematic diagram of a circuit block of the processor circuit 110 according to still another embodiment of the disclosure. For the synchronizer 10, the frequency generating device 100, the processor circuit 110, and the oscillator circuit 120 shown in FIG. 9, reference may be made to the related description of FIG. 1, and for the oscillator circuit 120 shown in FIG. 9, reference may be made to the related description of the oscillator circuit 120 shown in FIG. 7, so there will be no repetition. In the embodiment shown in FIG. 9, the processor circuit 110 includes the processor 111, the digital to analog converter (DAC) 112, the memory 113, and a filter 114. For the processor 111, the digital to analog converter 112, and the memory 113 shown in FIG. 9, reference may be made to the related description of the processor 111, the digital to analog converter 112, and the memory 113 shown in FIG. 8, so there will be no repetition.

In the embodiment shown in FIG. 9, the digital to analog converter 112 may convert the control value Vc1 into an analog voltage Vc2. The filter 114 is coupled to the digital to analog converter 112 to receive the analog voltage Vc2. The filter 114 may smooth the analog voltage Vc2 to generate the control voltage Vc for the oscillator circuit 120.

In summary, in some embodiments, the oscillator circuit 120 stores the frequency aging rate value Rfa and the control voltage slope Svc of its own oscillator 123. The processor circuit 110 may calculate the control voltage regulation rate value Rreg applicable to the oscillator 123 based on the frequency aging rate value Rfa and the control voltage slope Svc provided by the oscillator circuit 120. In other embodiments, the oscillator circuit 120 stores the control voltage regulation rate value Rreg associated with the frequency aging rate value Rfa of its own oscillator 123, and the processor circuit 110 may obtain the control voltage regulation rate value Rreg related to the oscillator 123 from the oscillator circuit 120. In any case, the processor circuit 110 may compensate the control voltage Vc applied to the oscillator 123 based on the control voltage regulation rate value Rreg, so as to perform frequency aging compensation for the clock frequency of the clock signal Fout.

FIG. 10 is a schematic flowchart of an operation method of a frequency generating device according to another embodiment of the disclosure. Please refer to FIG. 1 and FIG. 10. In Step S1010, the processor circuit 110 generates the control voltage Vc to the oscillator circuit 120, and the oscillator circuit 120 generates the clock signal Fout to the synchronizer 10. In Step S1020, the processor circuit 110 calculates a current frequency aging rate value of the oscillator circuit 120 based on a current clock frequency of the clock signal Fout, wherein the current frequency aging rate value is related to a current frequency change rate of the clock signal Fout before entering a holdover state.

Figure 11A:
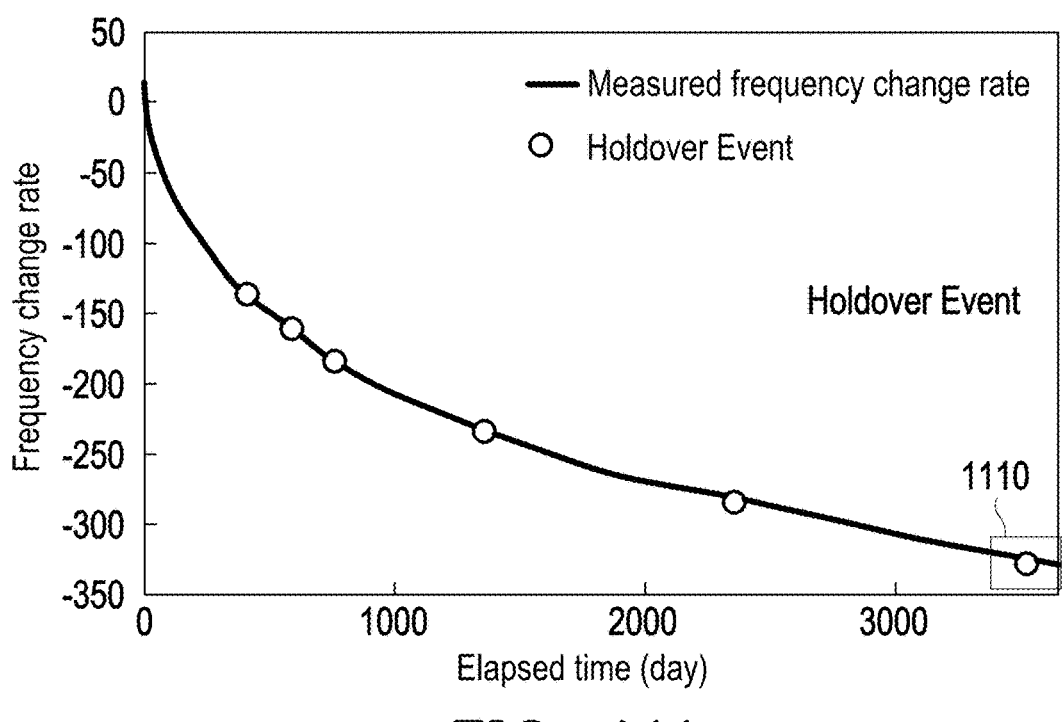
FIG. 11A and FIG. 11B are a schematic diagram of a frequency aging curve of the oscillator circuit according to an embodiment of the disclosure.
Figure 11B:
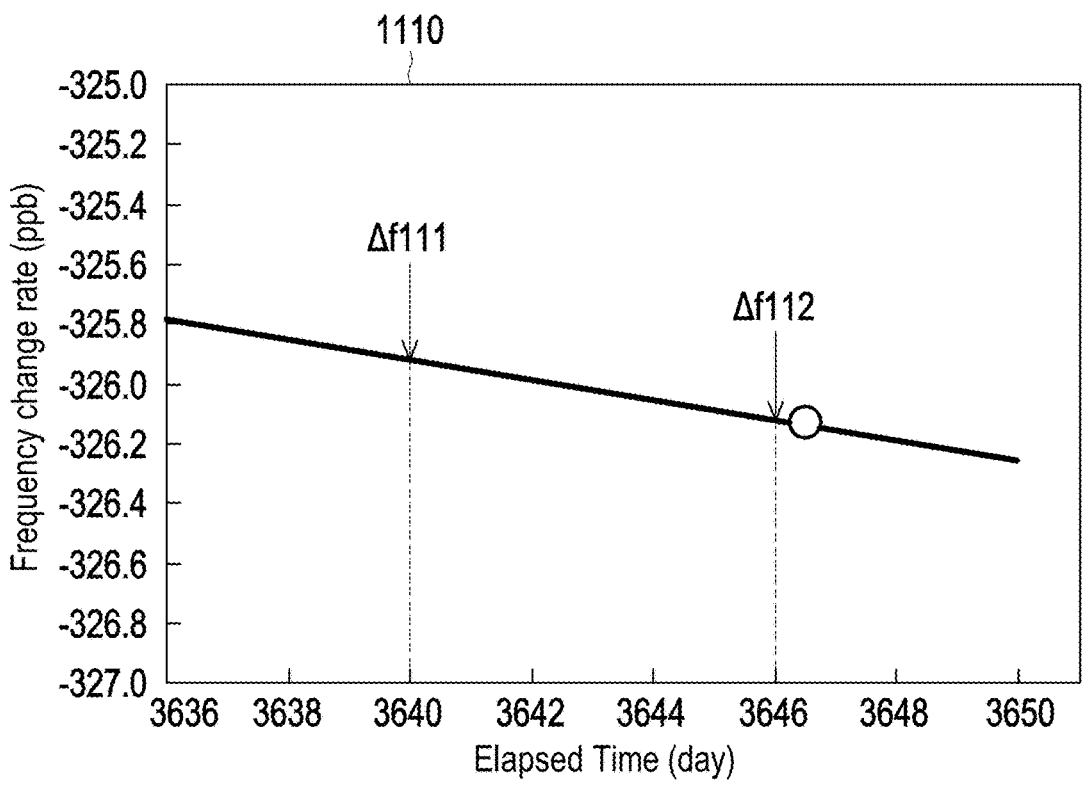

FIG. 11A and FIG. 11B are a schematic diagram of a frequency aging curve of the oscillator circuit 120 according to an embodiment of the disclosure. The horizontal axis of FIG. 11A and FIG. 11B represent elapsed time in the unit of days. The vertical axis of FIG. 11A and FIG. 11B represent a change amount (a frequency change rate) of the clock frequency of the clock signal Fout in the unit of ppb. The entire curve shown in FIG. 11A and FIG. 11B is the measured frequency change rate of the clock signal Fout at different time points. The curve of FIG. 11A and FIG. 11B can represent the frequency difference (or phase difference)

between the clock signal Fout and the external reference clock signal Fref at a current time point. Multiple holdover events occur in the elapsed timeline. The holdover event triggers the frequency generating device 100 to enter the holdover state until the holdover event ends. Compared with the curve predicted by the prediction model in the embodiment shown in FIG. 4, the curve shown in FIG. 11A and FIG. 11B is generated by actually measuring the current frequency of the clock signal Fout. The accuracy of measured current data is better than the accuracy of predicted data generated by using the prediction model.

In one embodiment, the processor circuit 110 can compare the reference frequency of the external reference clock signal Fref with the clock frequency of the clock signal Fout at different time points to obtain frequency differences at the different time points. In another embodiment, the synchronizer 10 can compare the reference frequency of the external reference clock signal Fref with the clock frequency of the clock signal Fout at different time points to obtain frequency differences at the different time points, and the processor circuit 110 reads the frequency differences from the synchronizer 10.

For example, FIG. 11B shows a portion curve 1110 in FIG. 11A. In the embodiment shown in FIG. 11B, the synchronizer 10 or the processor circuit 110 compares the reference frequency of the external reference clock signal Fref with the clock frequency of the clock signal Fout on day 3640 (the first time point) to obtain the frequency difference $\Delta f$ 111 (the first frequency difference), and compares the reference frequency of the external reference clock signal Fref with the clock frequency of the clock signal Fout on day 3646 (the second time point) to obtain the frequency difference $\Delta f$ 112 (the second frequency difference). In the case of synchronizer 10 compares the frequency differences, the processor circuit 110 reads the first frequency difference from the synchronizer 10 at the first time point before entering the holdover state, and the processor circuit 110 reads the second frequency difference from the synchronizer 10 at the second time point before entering the holdover state. The processor circuit 110 may use the first frequency difference and the second frequency difference to calculate the current frequency change rate FRATE as the current frequency aging rate value of the oscillator circuit 120. For example, the processor circuit 110 calculates the current frequency change rate FRATE=(($\Delta f$ 112−$\Delta f$ 111)/(3646−3640)).

Please refer to FIG. 1 and FIG. 10. In Step S1030, the processor circuit 110 calculates a control voltage regulation rate value Rreg based on the current frequency aging rate value and a control voltage slope Svc of the oscillator circuit, wherein the control voltage slope represents a slope of a relationship curve of the control voltage to the clock frequency. In one embodiment, the control voltage slope Svc of the oscillator circuit 120 is pre-stored in the processor circuit 110. In another embodiment, the processor circuit 110 reads the control voltage slope Svc of the oscillator circuit 120 from the oscillator circuit 120. For example, the processor circuit 110 may calculate a quotient of the current frequency aging rate value and the control voltage slope Svc as the control voltage regulation rate value Rreg, that is, Rreg=Rfa/Svc.

In Step S1040, the processor circuit 110 compensates the control voltage Vc based on the control voltage regulation rate value Rreg in the holdover state. In addition, the processor circuit 110 receives the clock frequency of the external reference clock signal Fref, and then compare the clock frequency of the external reference clock signal Fref with a certain set frequency to judge whether the clock frequency of the external reference clock signal Fref is abnormal. The set frequency may be determined according to the actual design and/or the application requirements. For example, the set frequency is a clock frequency based on the external reference clock signal Fref.

In Step S1050, the oscillator circuit 120 may generate the clock signal Fout, and the oscillator circuit 120 adjusts the clock frequency of the clock signal Fout according to the control voltage Vc. The processor circuit 110 may record a current voltage level of the control voltage Vc before the oscillator circuit 120 is powered down. After the oscillator circuit 120 is powered back on, the processor circuit 110 uses the pre-stored current voltage level as an initial control voltage level.

Based on the above, the processor circuit 110 may calculate the control voltage regulation rate value Rreg applicable to the oscillator circuit 120 based on the current frequency aging rate value and the control voltage slope Svc, and then compensate the control voltage Vc applied to the oscillator circuit 120 based on the control voltage regulation rate value Rreg, so as to perform frequency aging compensation.

Figure 12:
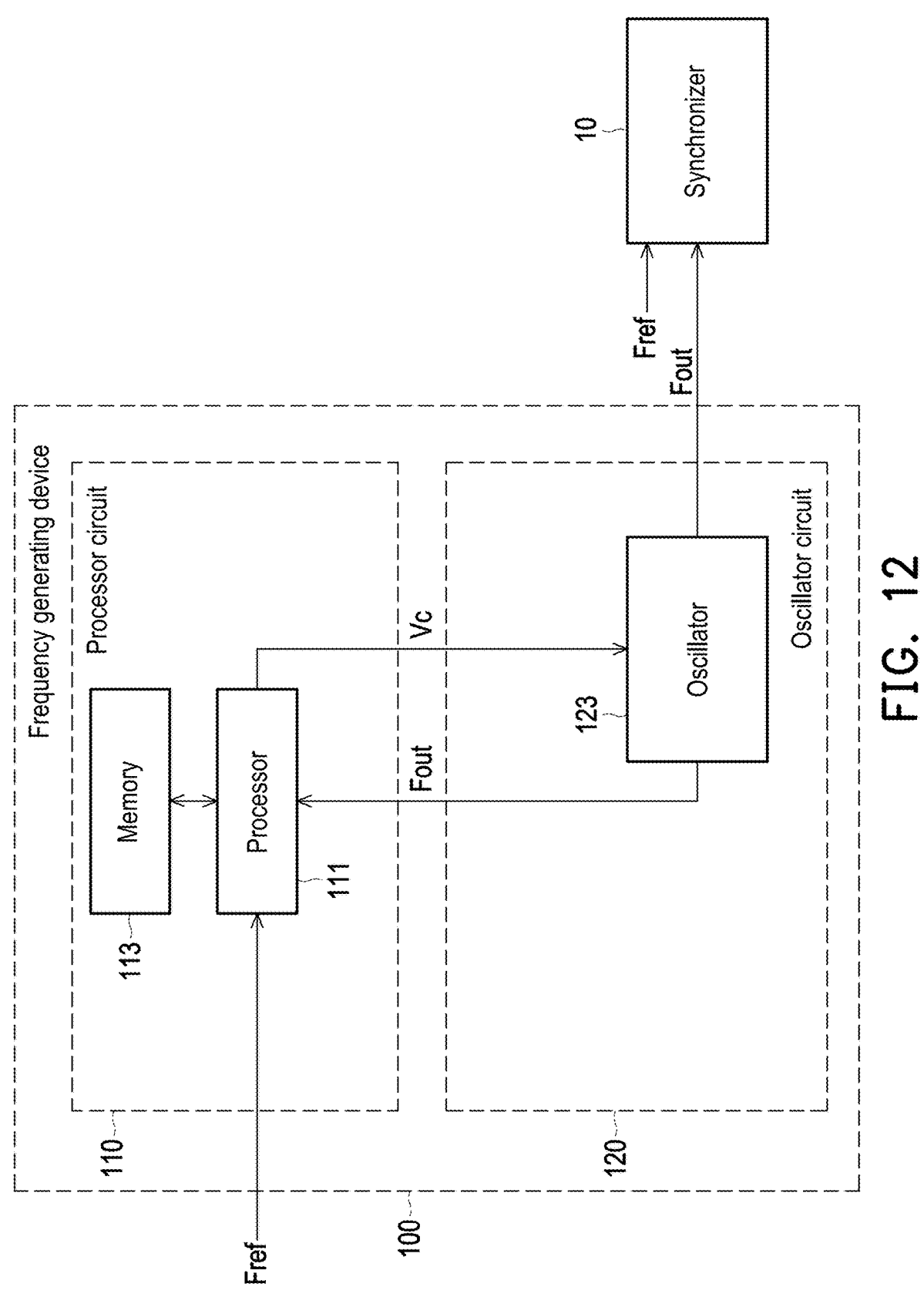
FIG. 12 is a schematic diagram of a circuit block of the processor circuit and the oscillator circuit according to an embodiment of the disclosure.

FIG. 12 is a schematic diagram of a circuit block of the processor circuit 110 and the oscillator circuit 120 according to an embodiment of the disclosure. For the synchronizer 10, the frequency generating device 100, the processor circuit 110, and the oscillator circuit 120 shown in FIG. 12, reference may be made to the related description of FIG. 1, so there will be no repetition. In the embodiment shown in FIG. 12, the oscillator circuit 120 includes an oscillator 123. The oscillator 123 is coupled to the processor circuit 110 to receive the control voltage Vc. The oscillator 123 generates the clock signal Fout according to the control voltage Vc. The oscillator 123 output the clock signal Fout to the synchronizer 10 and the processor circuit 110.

In the embodiment shown in FIG. 12, the processor circuit 110 includes a processor 111 and a memory 113. The memory 113 provides the control voltage slope Svc of the oscillator 123 to the processor 111. The processor 111 receives the external reference clock signal Fref, and then compares the reference frequency of the external reference clock signal Fref with the certain set frequency to judge whether the clock frequency of the external reference clock signal Fref is abnormal.

The processor 111 compares the reference frequency of the external reference clock signal Fref with the clock frequency of the clock signal Fout at a first time point before entering the holdover state to obtain a first frequency difference. The processor 111 compares the reference frequency of the external reference clock signal Fref with the current clock frequency of the clock signal Fout at a second time point before entering the holdover state to obtain a second frequency difference. The processor 111 uses the first frequency difference and the second frequency difference to calculate the current frequency change rate FRATE as the current frequency aging rate value. The processor 111 calculates a control voltage regulation rate value Rreg based on the current frequency aging rate value and the control voltage slope Svc of the oscillator 123. The processor 111 compensates the control voltage Vc by using the control voltage regulation rate value Rreg in the holdover state.

Figure 13:
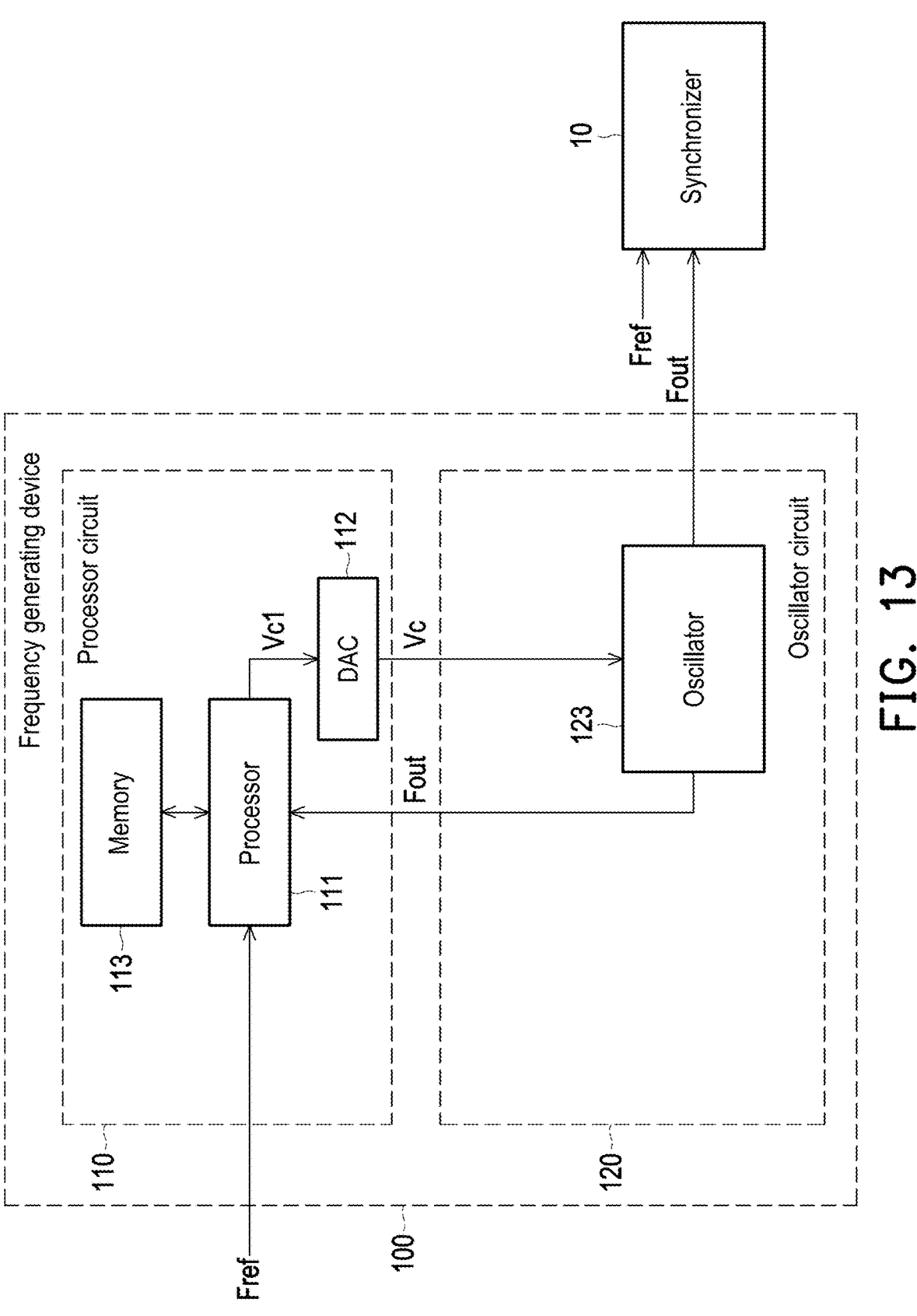
FIG. 13 is a schematic diagram of a circuit block of the processor circuit according to another embodiment of the disclosure.

FIG. 13 is a schematic diagram of a circuit block of the processor circuit 110 according to another embodiment of the disclosure. For the synchronizer 10, the frequency generating device 100, the processor circuit 110, and the oscillator circuit 120 shown in FIG. 13, reference may be made to the related description of FIG. 1, and for the oscillator circuit 120 shown in FIG. 13, reference may be made to the related description of the oscillator circuit 120 shown in FIG. 12, so there will be no repetition. In the embodiment shown in FIG. 13, the processor circuit 110 includes the processor 111, the digital to analog converter (DAC) 112, and a memory 113. For the processor 111 and the memory 113 shown in FIG. 13, reference may be made to the related description of the processor 111 and the memory 113 shown in FIG. 12, so there will be no repetition.

In the embodiment shown in FIG. 13, the processor 111 compensates a control value Vc1 by using the control voltage regulation rate value Rreg. The DAC 112 is coupled to the processor 111 to receive the control value Vc1. The DAC 112 converts the control value Vc1 into the control voltage Vc for the oscillator circuit 120. Based on the above, the DAC 112 provides the compensated control voltage Vc to the oscillator 123, so as to perform frequency aging compensation on the clock frequency of the clock signal Fout.

Figure 14:
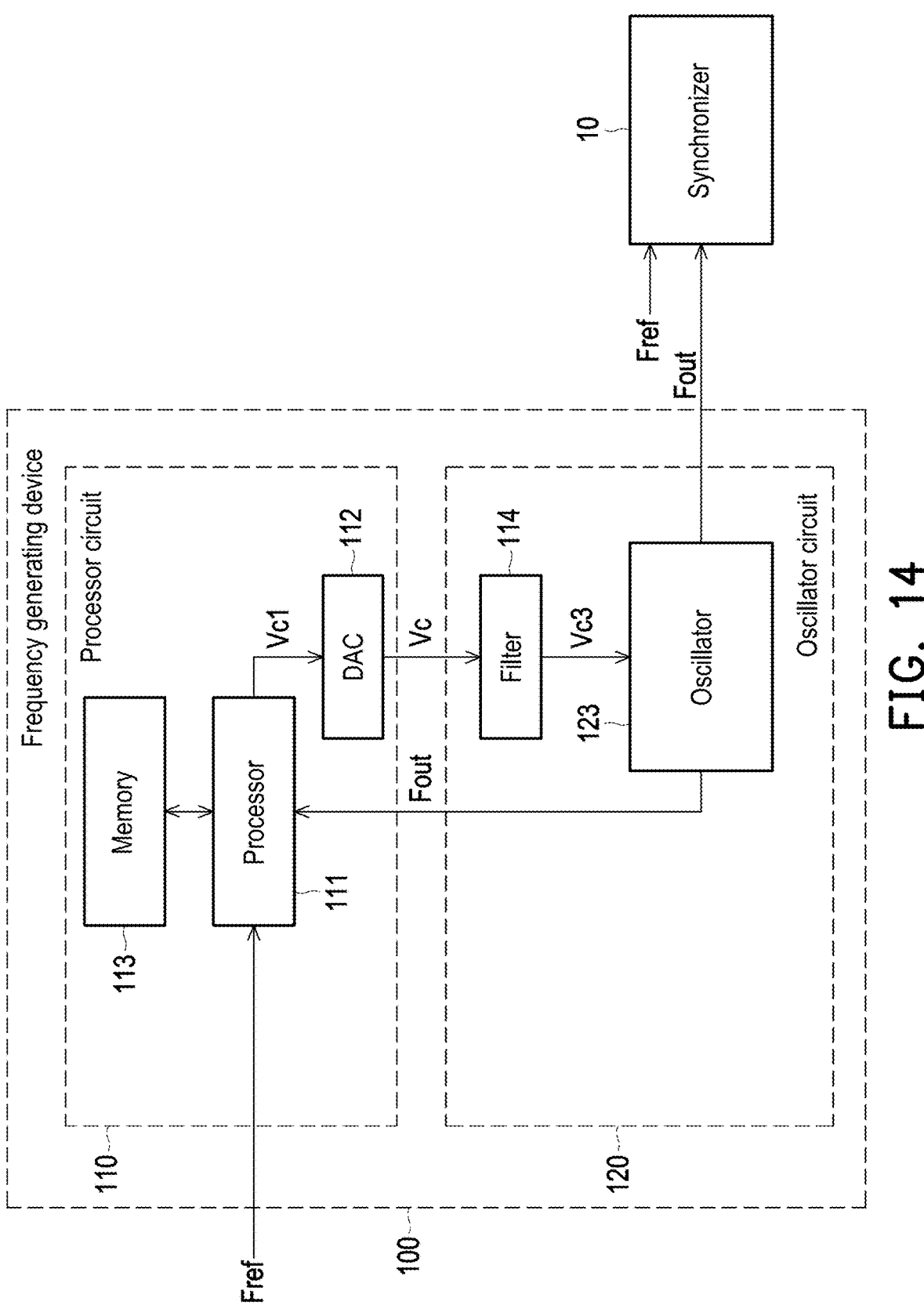
FIG. 14 is a schematic diagram of a circuit block of the oscillator circuit according to another embodiment of the disclosure.

FIG. 14 is a schematic diagram of a circuit block of the oscillator circuit 120 according to another embodiment of the disclosure. For the synchronizer 10, the frequency generating device 100, the processor circuit 110, and the oscillator circuit 120 shown in FIG. 14, reference may be made to the related description of FIG. 1, and for the processor circuit 110 shown in FIG. 14, reference may be made to the related description of the processor circuit 110 shown in FIG. 13, so there will be no repetition. In the embodiment shown in FIG. 14, the oscillator circuit 120 includes the oscillator 123 and a filter 114. The filter 114 is coupled to the processor circuit 110 to receive the compensated control voltage Vc. The filter 114 may smooth the control voltage Vc to generate the smoothed control voltage Vc3 for the oscillator 123.

Figure 15:
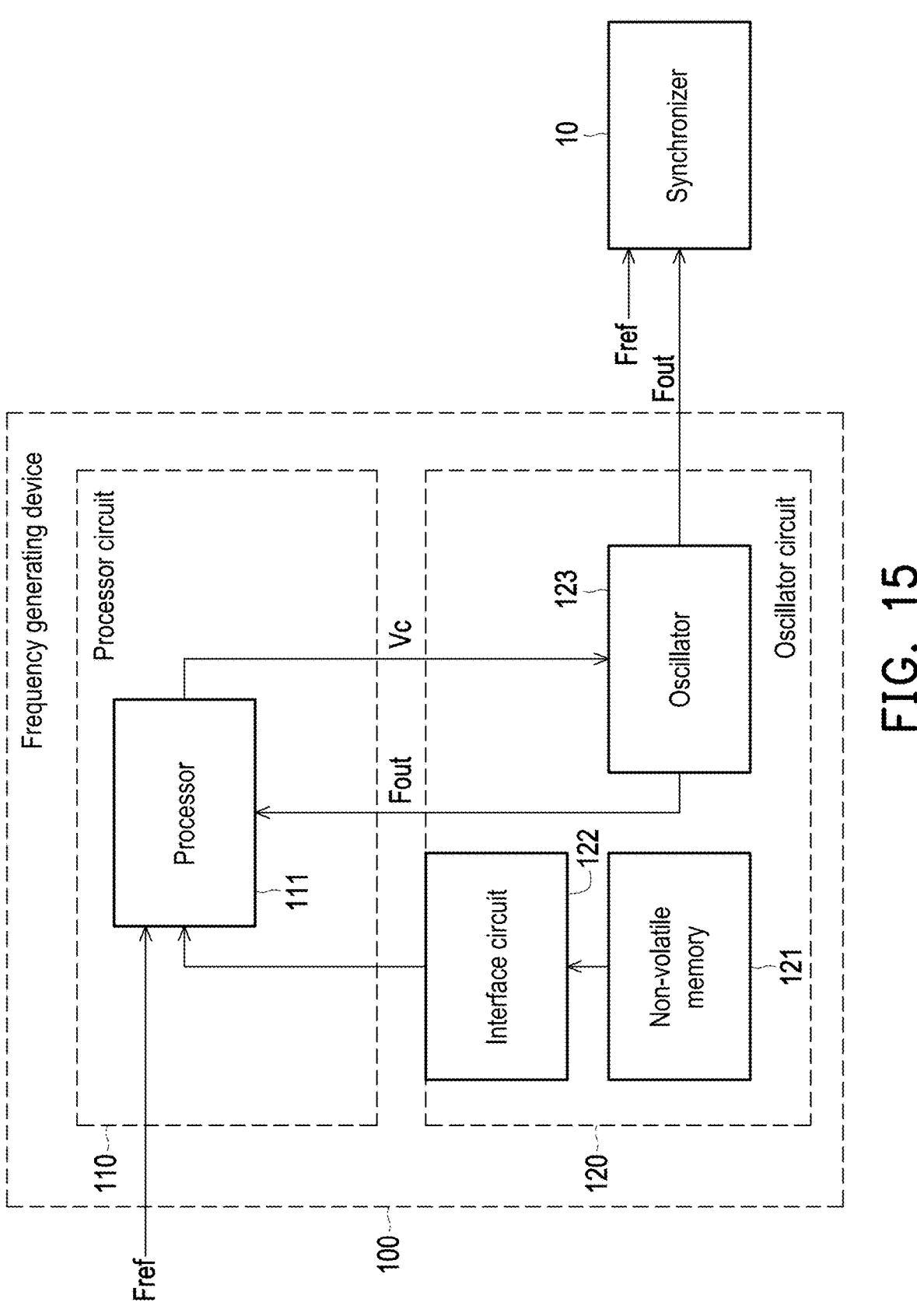
FIG. 15 is a schematic diagram of a circuit block of the processor circuit and the oscillator circuit according to an embodiment of the disclosure.

FIG. 15 is a schematic diagram of a circuit block of the processor circuit 110 and the oscillator circuit 120 according to an embodiment of the disclosure. For the synchronizer 10, the frequency generating device 100, the processor circuit 110, and the oscillator circuit 120 shown in FIG. 15, reference may be made to the related description of FIG. 1, so there will be no repetition. In the embodiment shown in FIG. 15, the oscillator circuit 120 includes a non-volatile memory 121, an interface circuit 122, and an oscillator 123. The non-volatile memory 121 provides the control voltage slope Svc of the oscillator 123. The interface circuit 122 is coupled to the non-volatile memory 121. The interface circuit 122 reads the control voltage slope Svc from the non-volatile memory 121, and provides the control voltage slope Svc of the oscillator 123 to the processor circuit 110. The oscillator 123 is coupled to the processor circuit 110 to receive the control voltage Vc. The oscillator 123 generates the clock signal Fout according to the control voltage Vc. The oscillator 123 output the clock signal Fout to the synchronizer 10 and the processor circuit 110.

In the embodiment shown in FIG. 15, the processor circuit 110 includes the processor 111. The processor 111 reads the control voltage slope Svc of the oscillator 123 from the oscillator circuit 120. The processor 111 receives the external reference clock signal Fref, and then compares the reference frequency of the external reference clock signal Fref with the clock frequency of the clock signal Fout at a first time point before entering the holdover state to obtain a first frequency difference. The processor 111 compares the reference frequency of the external reference clock signal Fref with the current clock frequency of the clock signal Fout at a second time point before entering the holdover state to obtain a second frequency difference. The processor 111 uses the first frequency difference and the second frequency difference to calculate the current frequency change rate FRATE as the current frequency aging rate value. The processor 111 calculates a control voltage regulation rate value Rreg based on the current frequency aging rate value and the control voltage slope Svc of the oscillator 123. The processor 111 compensates the control voltage Vc by using the control voltage regulation rate value Rreg in the holdover state.

Figure 16:
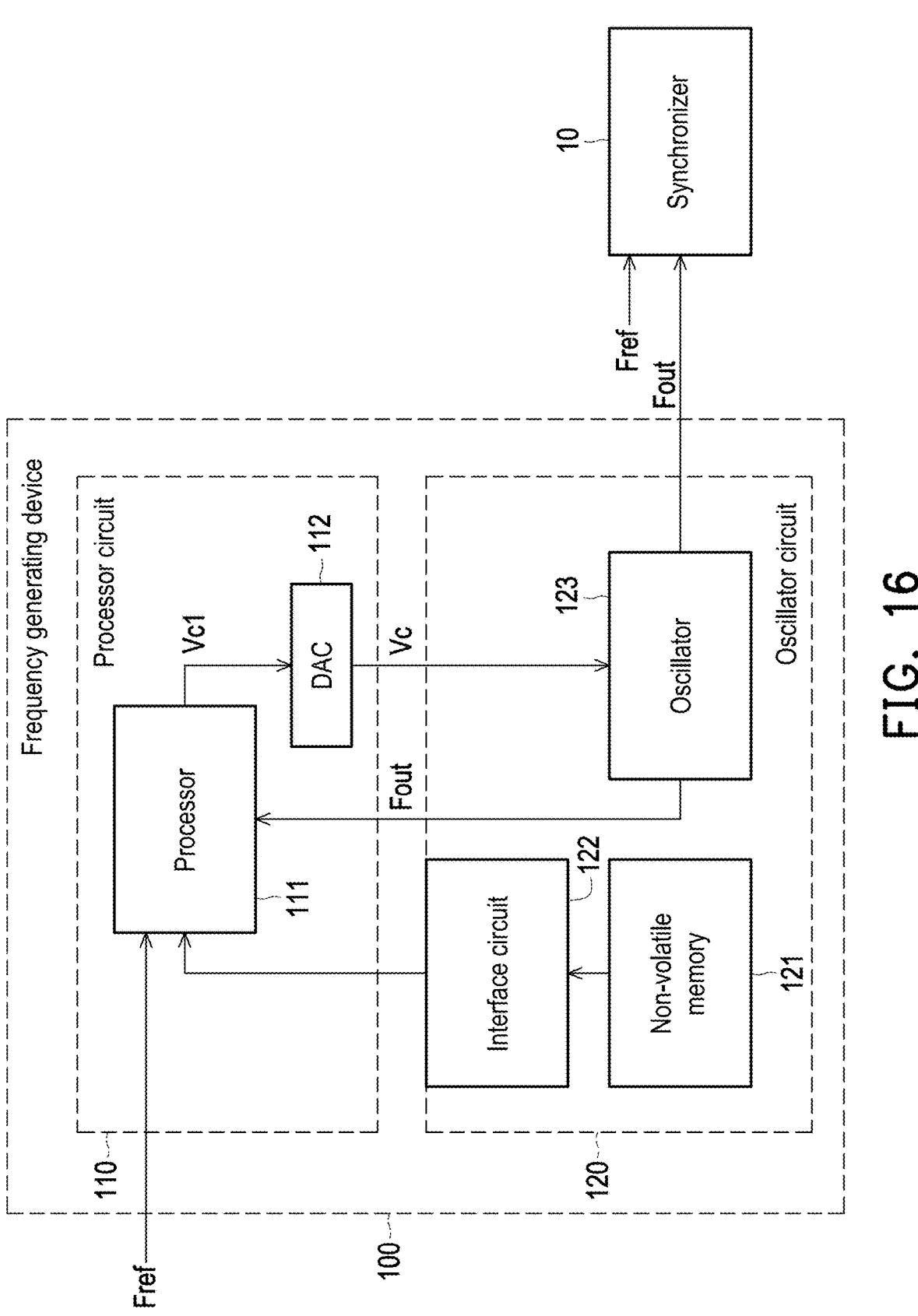
FIG. 16 is a schematic diagram of a circuit block of the processor circuit according to another embodiment of the disclosure.

FIG. 16 is a schematic diagram of a circuit block of the processor circuit 110 according to another embodiment of the disclosure. For the synchronizer 10, the frequency generating device 100, the processor circuit 110, and the oscillator circuit 120 shown in FIG. 16, reference may be made to the related description of FIG. 1, and for the oscillator circuit 120 shown in FIG. 16, reference may be made to the related description of the oscillator circuit 120 shown in FIG. 15, so there will be no repetition. In the embodiment shown in FIG. 16, the processor circuit 110 includes the processor 111 and the DAC 112. For the processor 111 shown in FIG. 16, reference may be made to the related description of the processor 111 shown in FIG. 15, so there will be no repetition. In the embodiment shown in FIG. 16, the processor 111 compensates a control value Vc1 by using the control voltage regulation rate value Rreg. The DAC 112 is coupled to the processor 111 to receive the control value Vc1. The DAC 112 converts the control value Vc1 into the control voltage Vc for the oscillator circuit 120. Based on the above, the DAC 112 provides the compensated control voltage Vc to the oscillator 123, so as to perform frequency aging compensation on the clock frequency of the clock signal Fout.

Figure 17:
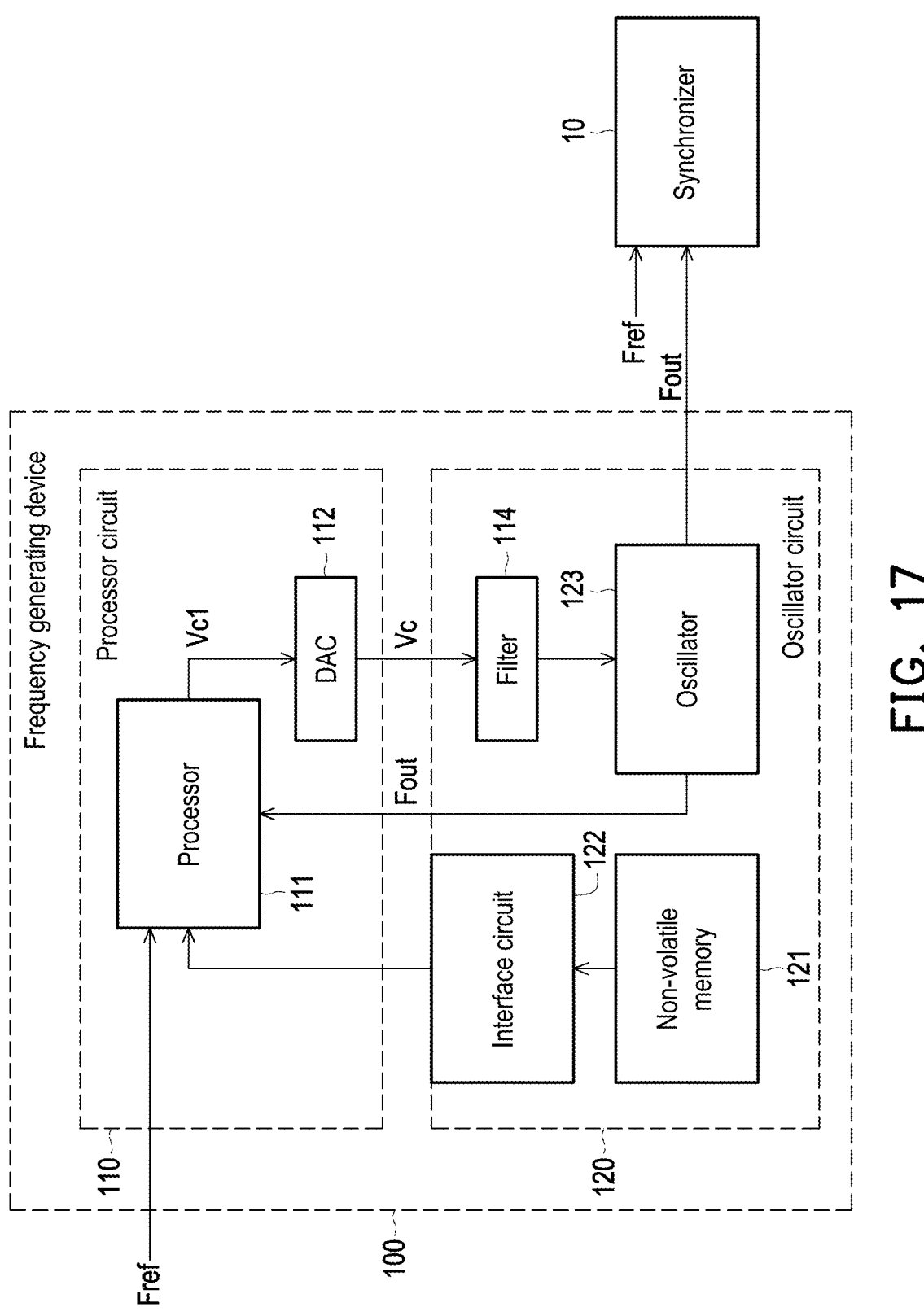
FIG. 17 is a schematic diagram of a circuit block of the oscillator circuit according to another embodiment of the disclosure.

FIG. 17 is a schematic diagram of a circuit block of the oscillator circuit 120 according to another embodiment of the disclosure. For the synchronizer 10, the frequency generating device 100, the processor circuit 110, and the oscillator circuit 120 shown in FIG. 17, reference may be made to the related description of FIG. 1, and for the processor circuit 110 shown in FIG. 17, reference may be made to the related description of the processor circuit 110 shown in FIG. 16, so there will be no repetition. In the embodiment shown in FIG. 17, the oscillator circuit 120 includes the non-volatile memory 121, the interface circuit 122, the oscillator 123 and a filter 114. The filter 114 is coupled to the processor circuit 110 to receive the compensated control voltage Vc. The filter 114 may smooth the control voltage Vc to generate the smoothed control voltage Vc3 for the oscillator 123.

Figure 18:
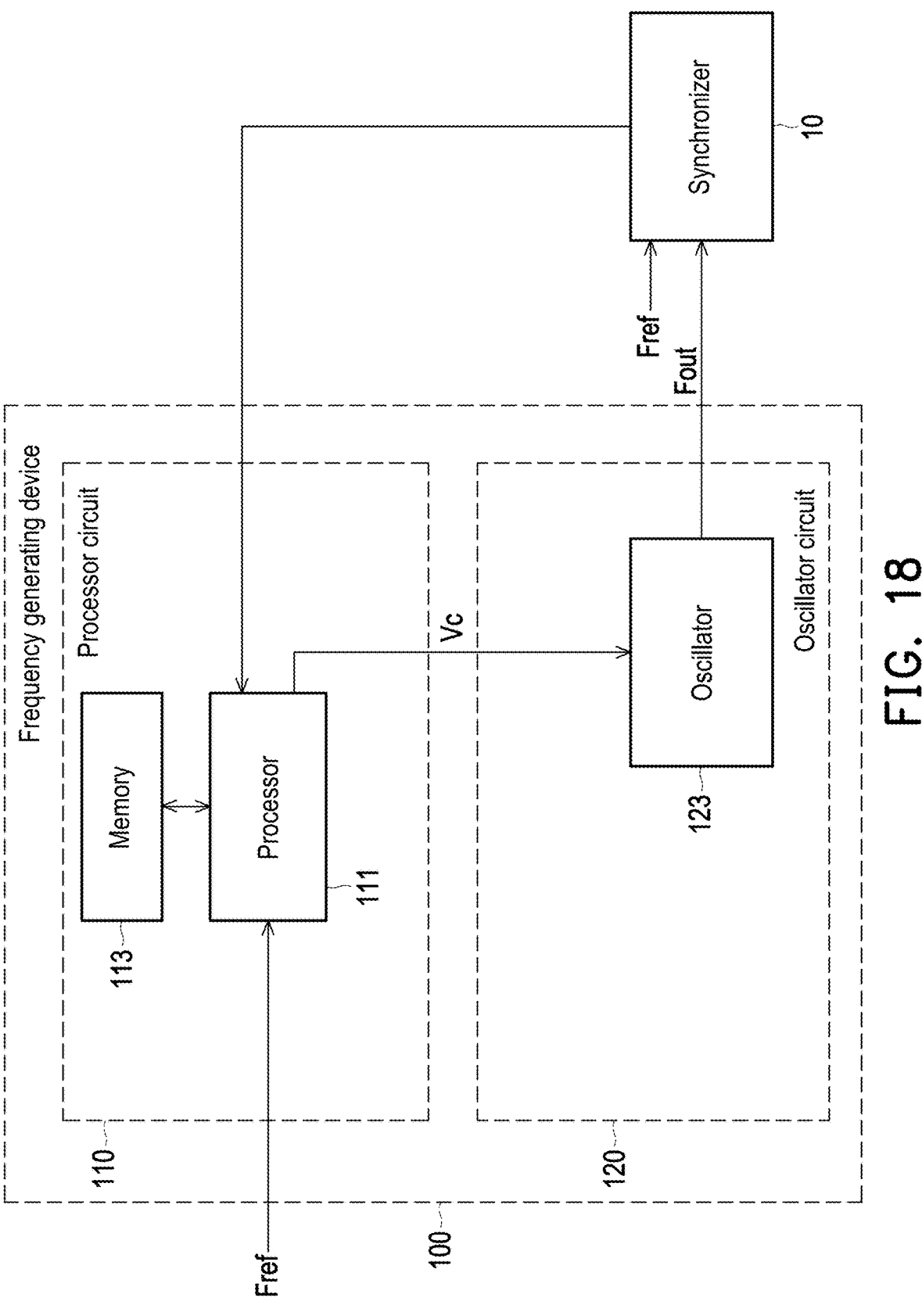
FIG. 18 is a schematic diagram of a circuit block of the processor circuit according to another embodiment of the disclosure.

FIG. 18 is a schematic diagram of a circuit block of the processor circuit 110 according to another embodiment of the disclosure. For the synchronizer 10, the frequency generating device 100, the processor circuit 110, and the oscillator circuit 120 shown in FIG. 18, reference may be made to the related description of FIG. 1, and for the oscillator circuit 120 shown in FIG. 18, reference may be made to the related description of the oscillator circuit 120 shown in FIG. 12, so there will be no repetition. In the embodiment shown in FIG. 18, the processor circuit 110 includes a processor 111 and a memory 113. For the processor 111 and the memory 113 shown in FIG. 18, reference may be made to the related description of the processor 111 and the memory 113 shown in FIG. 12, so there will be no repetition.

In the embodiment shown in FIG. 18, the synchronizer 10 can compare the reference frequency of the external reference clock signal Fref with the clock frequency of the clock signal Fout at different time points to obtain frequency differences at the different time points, and the processor circuit 110 reads the frequency differences from the synchronizer 10. The processor 111 reads a first frequency difference from the synchronizer 10, wherein the first frequency difference is a comparison result of the synchronizer 10 comparing a reference frequency of the external reference clock signal Fref with the clock frequency of the clock signal Fout at a first time point before entering the holdover state. The processor 111 reads a second frequency difference from the synchronizer 10, wherein the second frequency difference is a comparison result of the synchronizer 10 comparing the reference frequency of the external reference clock signal Fref with the clock frequency of the clock signal Fout at a second time point before entering the holdover state. The processor 111 uses the first frequency difference and the second frequency difference to calculate the current frequency change rate FRATE as the current frequency aging rate value. The processor 111 calculates a control voltage regulation rate value Rreg based on the current frequency aging rate value and the control voltage slope Svc of the oscillator 123. The processor 111 compensates the control voltage Vc by using the control voltage regulation rate value Rreg in the holdover state.

Figure 19:
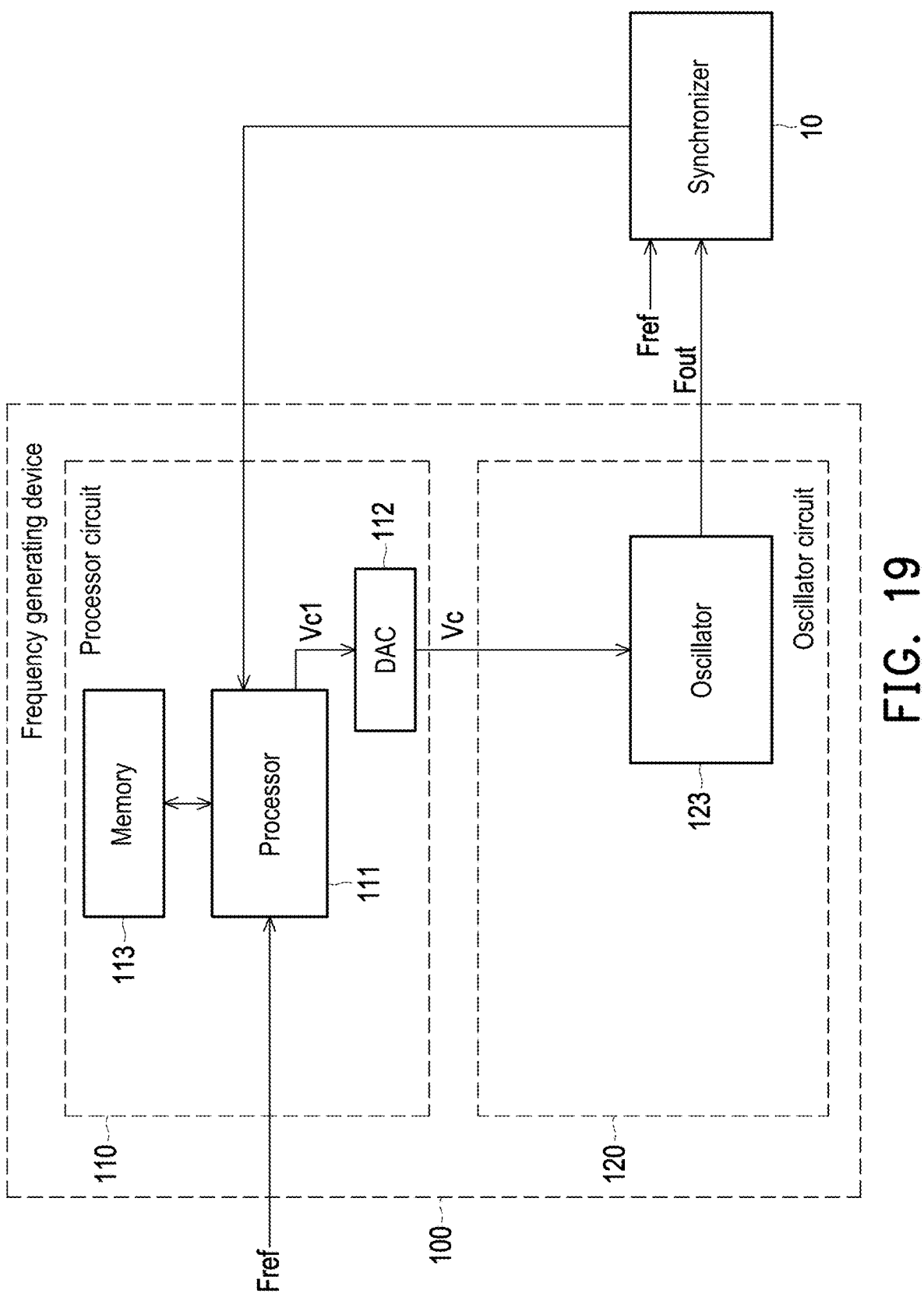
FIG. 19 is a schematic diagram of a circuit block of the processor circuit according to another embodiment of the disclosure.

FIG. 19 is a schematic diagram of a circuit block of the processor circuit 110 according to another embodiment of the disclosure. For the synchronizer 10, the frequency generating device 100, the processor circuit 110, and the oscillator circuit 120 shown in FIG. 19, reference may be made to the related description of FIG. 1, and for the synchronizer 10 and the oscillator circuit 120 shown in FIG. 19, reference may be made to the related description of the synchronizer 10 and the oscillator circuit 120 shown in FIG. 18, so there will be no repetition. In the embodiment shown in FIG. 19, the processor circuit 110 includes the processor 111, the DAC 112, and a memory 113. For the processor 111 and the memory 113 shown in FIG. 19, reference may be made to the related description of the processor 111 and the memory 113 shown in FIG. 18, so there will be no repetition. In the embodiment shown in FIG. 19, the processor 111 compensates a control value Vc1 by using the control voltage regulation rate value Rreg. The DAC 112 is coupled to the processor 111 to receive the control value Vc1. The DAC 112 converts the control value Vc1 into the control voltage Vc for the oscillator circuit 120. Based on the above, the DAC 112 provides the compensated control voltage Vc to the oscillator 123, so as to perform frequency aging compensation on the clock frequency of the clock signal Fout.

Figure 20:
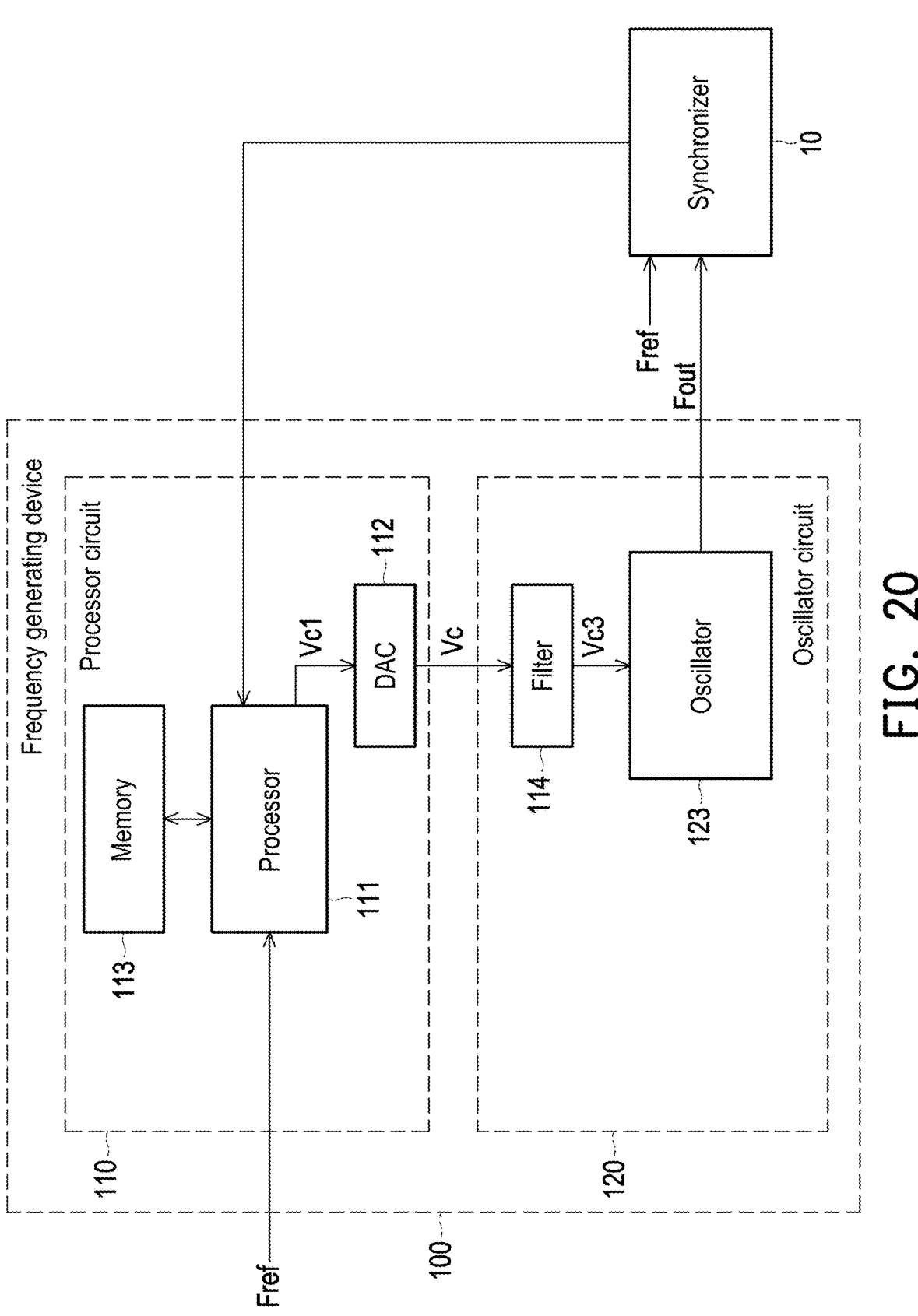
FIG. 20 is a schematic diagram of a circuit block of the oscillator circuit according to another embodiment of the disclosure.

FIG. 20 is a schematic diagram of a circuit block of the oscillator circuit 120 according to another embodiment of the disclosure. For the synchronizer 10, the frequency generating device 100, the processor circuit 110, and the oscillator circuit 120 shown in FIG. 20, reference may be made to the related description of FIG. 1, and for the processor circuit 110 shown in FIG. 20, reference may be made to the related description of the processor circuit 110 shown in FIG. 19, so there will be no repetition. In the embodiment shown in FIG. 20, the oscillator circuit 120 includes the oscillator 123 and a filter 114. The filter 114 is coupled to the processor circuit 110 to receive the compensated control voltage Vc. The filter 114 may smooth the control voltage Vc to generate the smoothed control voltage Vc3 for the oscillator 123.

Figure 21:
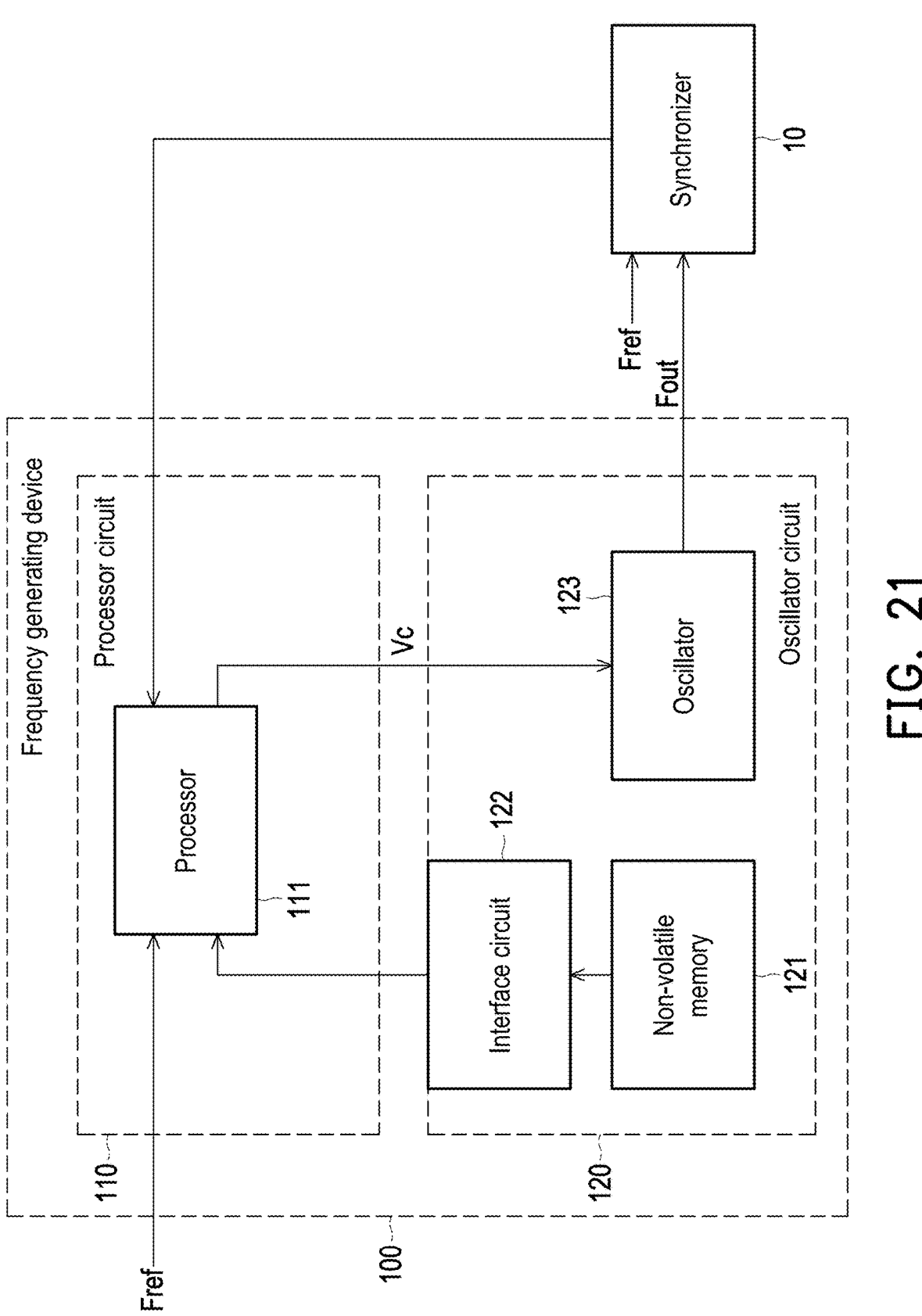
FIG. 21 is a schematic diagram of a circuit block of the processor circuit and the oscillator circuit according to an embodiment of the disclosure.

FIG. 21 is a schematic diagram of a circuit block of the processor circuit 110 and the oscillator circuit 120 according to an embodiment of the disclosure. For the synchronizer 10, the frequency generating device 100, the processor circuit 110, and the oscillator circuit 120 shown in FIG. 21, reference may be made to the related description of FIG. 1, so there will be no repetition. In the embodiment shown in FIG. 21, the oscillator circuit 120 includes anon-volatile memory 121, an interface circuit 122, and an oscillator 123. The non-volatile memory 121 provides the control voltage slope Svc of the oscillator 123. The interface circuit 122 reads the control voltage slope Svc from the non-volatile memory 121, and provides the control voltage slope Svc of the oscillator 123 to the processor circuit 110. The oscillator 123 generates the clock signal Fout according to the control voltage Vc. The oscillator 123 output the clock signal Fout to the synchronizer 10 and the processor circuit 110.

In the embodiment shown in FIG. 21, the processor circuit 110 includes the processor 111. The processor 111 reads the control voltage slope Svc of the oscillator 123 from the oscillator circuit 120. For the synchronizer 10 shown in FIG. 21, reference may be made to the related description of the synchronizer 10 shown in FIG. 18, so there will be no repetition. The processor 111 uses the first frequency difference and the second frequency difference read from the synchronizer 10 to calculate the current frequency change rate FRATE as the current frequency aging rate value. The processor 111 calculates a control voltage regulation rate value Rreg based on the current frequency aging rate value and the control voltage slope Svc of the oscillator 123. The processor 111 compensates the control voltage Vc by using the control voltage regulation rate value Rreg in the holdover state.

Figure 22:
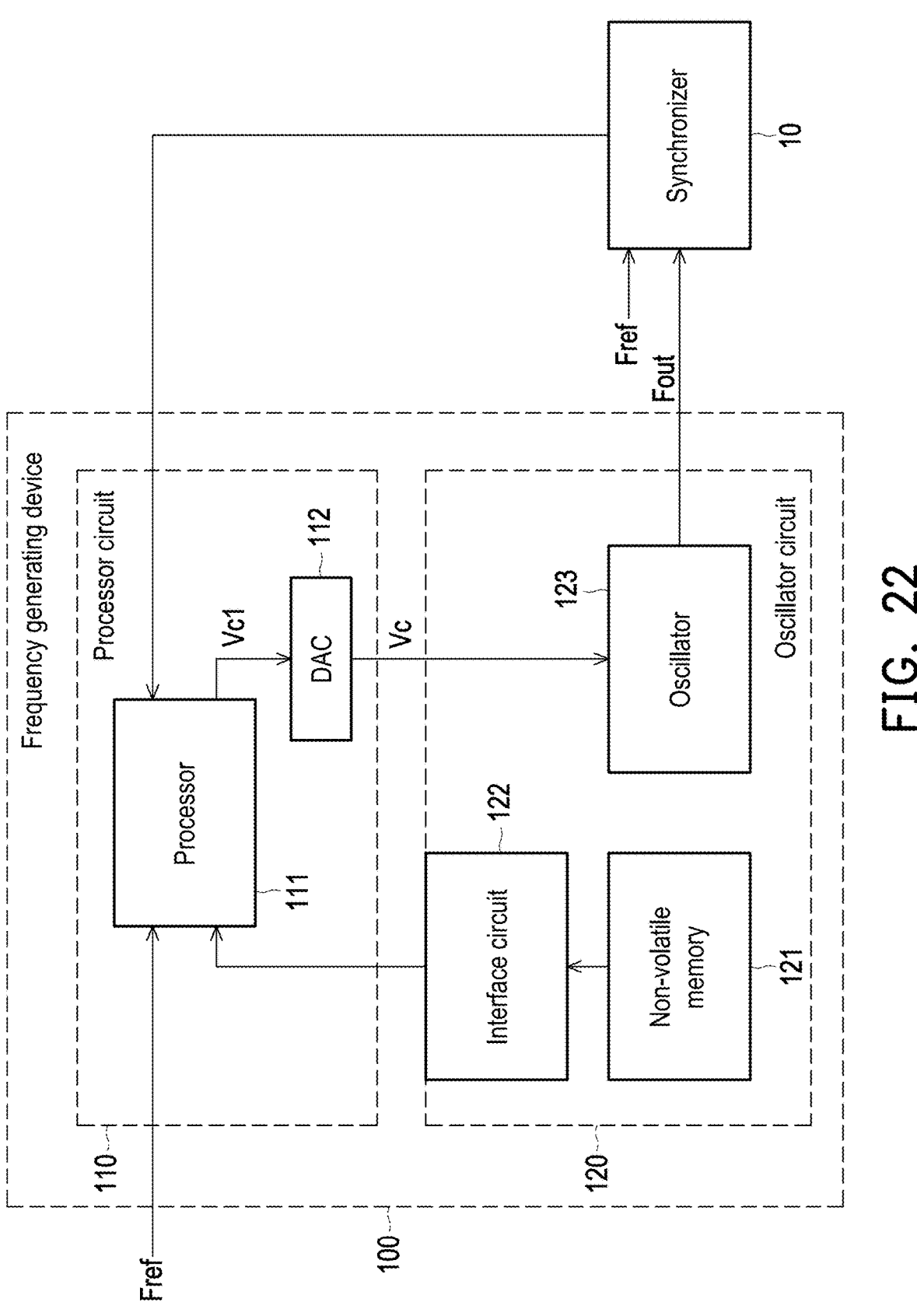
FIG. 22 is a schematic diagram of a circuit block of the processor circuit according to another embodiment of the disclosure.

FIG. 22 is a schematic diagram of a circuit block of the processor circuit 110 according to another embodiment of the disclosure. For the synchronizer 10, the frequency generating device 100, the processor circuit 110, and the oscillator circuit 120 shown in FIG. 22, reference may be made to the related description of FIG. 1, and for the synchronizer 10 and the oscillator circuit 120 shown in FIG. 22, reference may be made to the related description of the synchronizer 10 and the oscillator circuit 120 shown in FIG. 21, so there will be no repetition. In the embodiment shown in FIG. 22, the processor circuit 110 includes the processor 111 and the DAC 112. For the processor 111 shown in FIG. 22, reference may be made to the related description of the processor 111 shown in FIG. 21, so there will be no repetition. In the embodiment shown in FIG. 22, the processor 111 compensates a control value Vc1 by using the control voltage regulation rate value Rreg. The DAC 112 is coupled to the processor 111 to receive the control value Vc1. The DAC 112 converts the control value Vc1 into the control voltage Vc for the oscillator circuit 120. Based on the above, the DAC 112 provides the compensated control voltage Vc to the oscillator 123, so as to perform frequency aging compensation on the clock frequency of the clock signal Fout.

Figure 23:
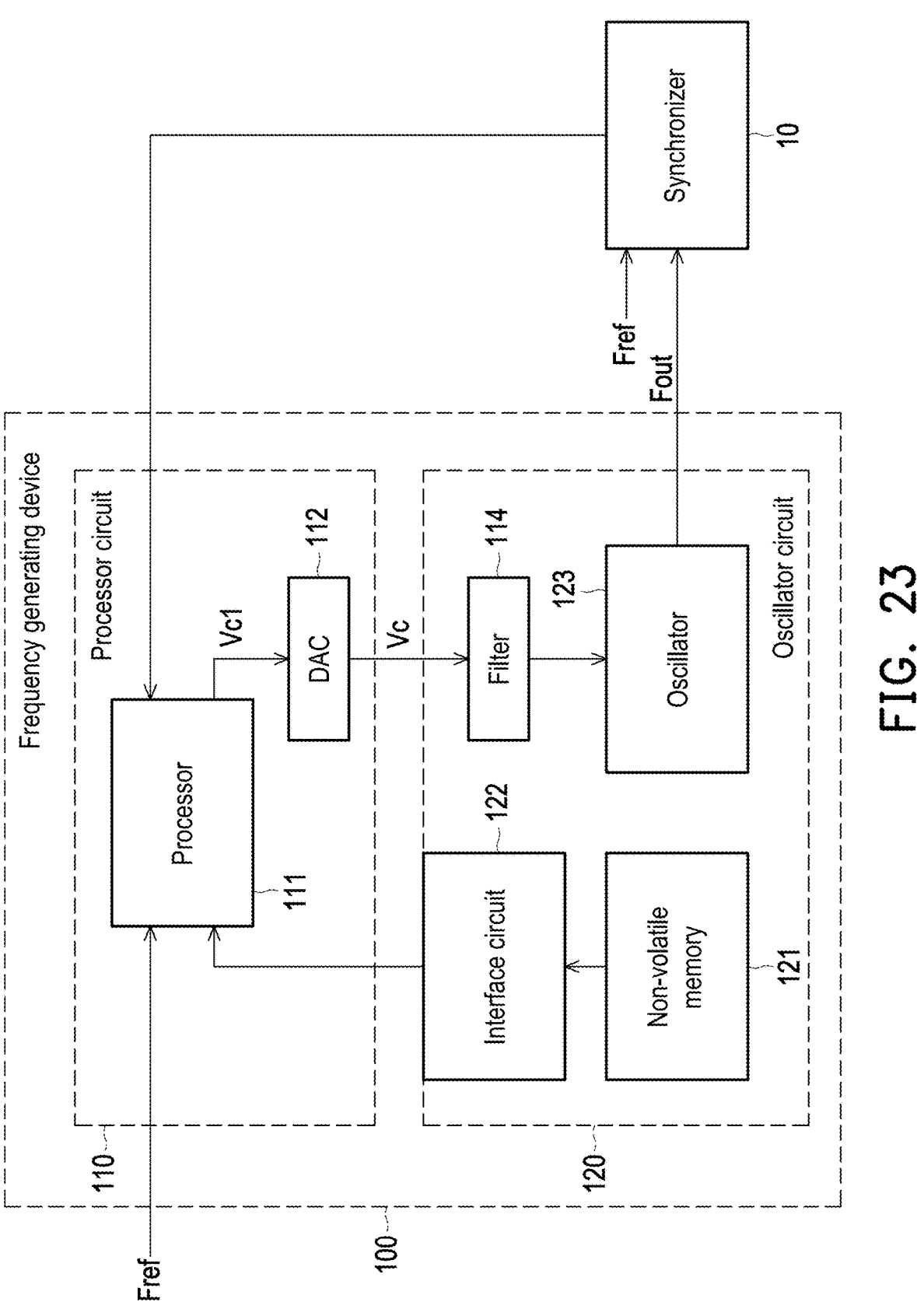
FIG. 23 is a schematic diagram of a circuit block of the oscillator circuit according to another embodiment of the disclosure.

FIG. 23 is a schematic diagram of a circuit block of the oscillator circuit 120 according to another embodiment of the disclosure. For the synchronizer 10, the frequency generating device 100, the processor circuit 110, and the oscillator circuit 120 shown in FIG. 23, reference may be made to the related description of FIG. 1, and for the synchronizer 10 and the processor circuit 110 shown in FIG. 23, reference may be made to the related description of the synchronizer 10 and the processor circuit 110 shown in FIG. 22, so there will be no repetition. In the embodiment shown in FIG. 23, the oscillator circuit 120 includes the non-volatile memory 121, the interface circuit 122, the oscillator 123 and a filter 114. For the non-volatile memory 121, the interface circuit 122 and the oscillator 123 shown in FIG. 23, reference may be made to the related description of FIG. 21, so there will be no repetition. The filter 114 is coupled to the processor circuit 110 to receive the compensated control voltage Vc. The filter 114 may smooth the control voltage Vc to generate the smoothed control voltage Vc3 for the oscillator 123.

Figure 24:
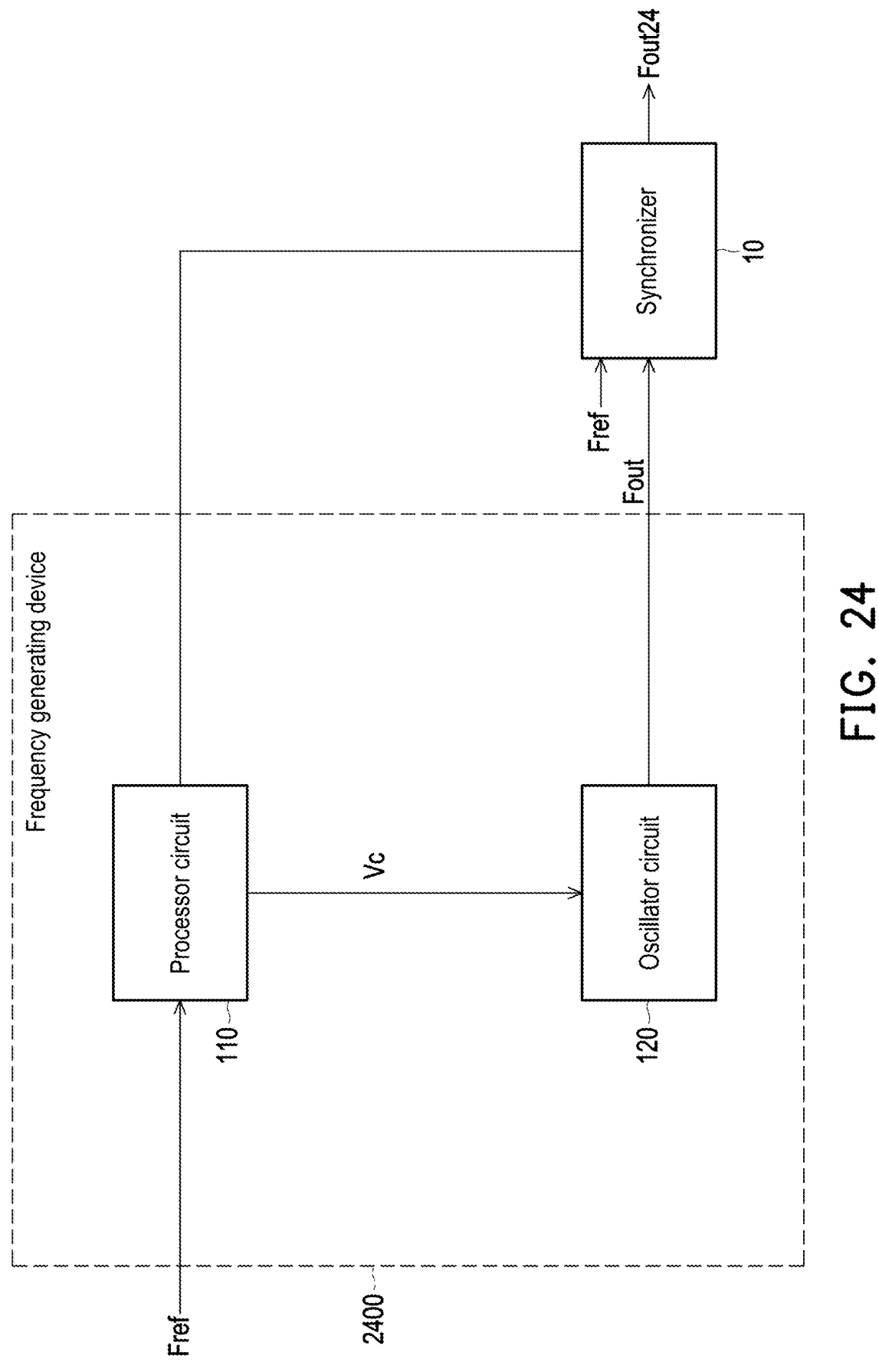
FIG. 24 is a schematic diagram of a circuit block of the frequency generating device according to another embodiment of the disclosure.

FIG. 24 is a schematic diagram of a circuit block of the frequency generating device 2400 according to another embodiment of the disclosure. For the synchronizer 10, the frequency generating device 2400, the processor circuit 110, and the oscillator circuit 120 shown in FIG. 24, reference may be made to the related description of the synchronizer 10, the frequency generating device 100, the processor circuit 110, and the oscillator circuit 120 shown in FIG. 1, so there will be no repetition. In the embodiment shown in FIG. 24, the processor circuit 110 provides a frequency regulation value FREG to the synchronizer 10 in the holdover state to compensate an output frequency Fout24 of the synchronizer 10.

FIG. 25 is a schematic flowchart of an operation method of a frequency generating device according to another embodiment of the disclosure. Please refer to FIG. 24 and FIG. 25. In Step S2510, the processor circuit 110 generates the control voltage Vc to the oscillator circuit 120, and the oscillator circuit 120 generates the clock signal Fout to the synchronizer 10. In Step S2520, the processor circuit 110 calculates a current frequency aging rate value of the oscillator circuit 120 based on a current clock frequency of the clock signal Fout. For Step S2510 and Step S2520 shown in FIG. 25, reference may be made to the related description of Step S1010 and Step S1020 shown in FIG. 10, so there will be no repetition.

In Step S2530, the processor circuit 110 calculates a frequency regulation value FREG based on the current frequency aging rate value and an oscillator resolution of the synchronizer 10, wherein the oscillator resolution represents a frequency regulation granularity of an oscillator in the synchronizer 10. In one embodiment, the oscillator resolution of the synchronizer 10 is pre-stored in the processor circuit 110. In another embodiment, the processor circuit 110 reads the oscillator resolution of the synchronizer 10 from the synchronizer 10. In Step S2540, the processor circuit 110 provides the frequency regulation value FREG to the synchronizer 10 in the holdover state to compensate the output frequency Fout24 of the synchronizer 10.

Figure 26:
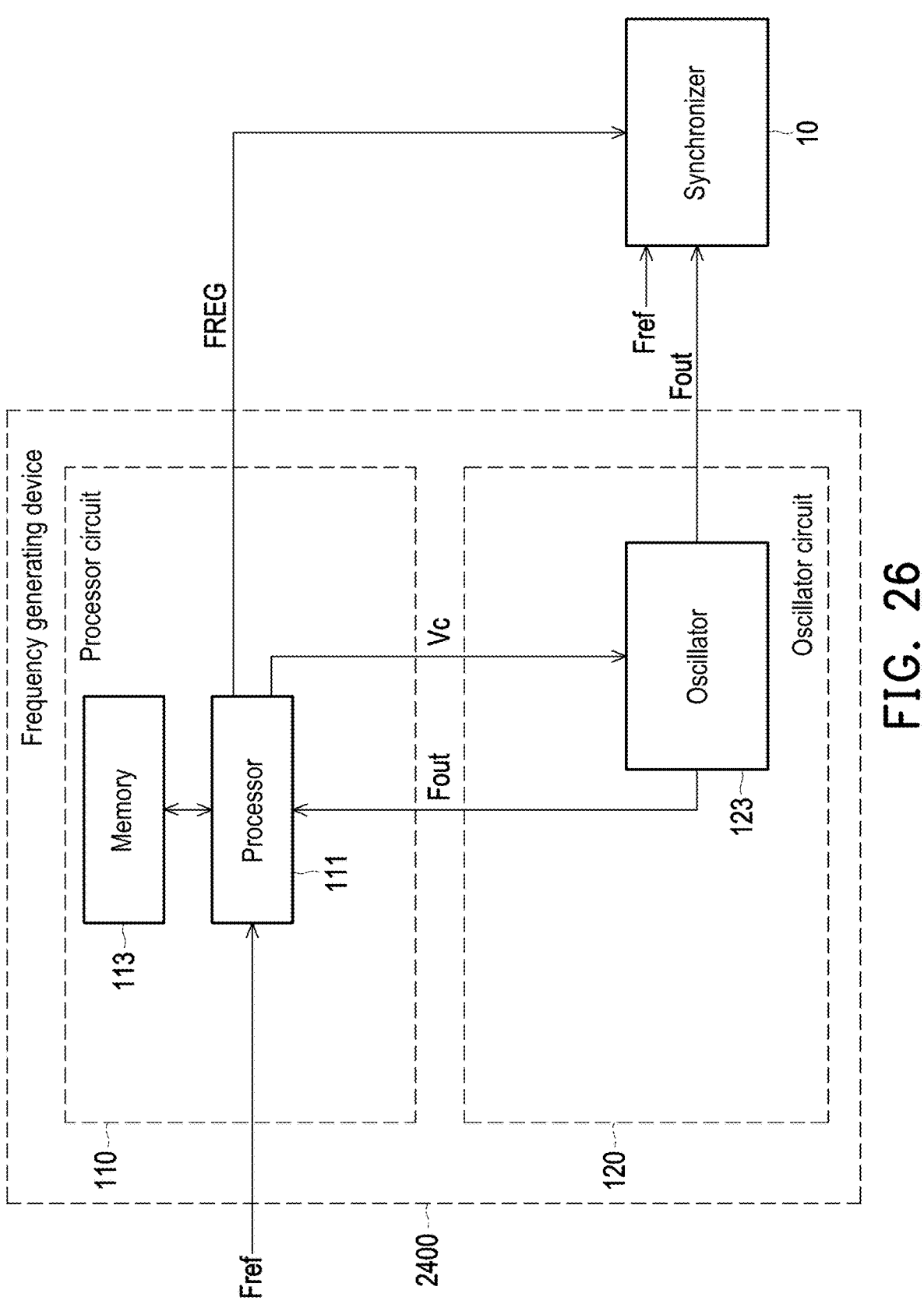
FIG. 26 is a schematic diagram of a circuit block of the processor circuit and the oscillator circuit according to an embodiment of the disclosure.

FIG. 26 is a schematic diagram of a circuit block of the processor circuit 110 and the oscillator circuit 120 according to an embodiment of the disclosure. For the synchronizer 10, the frequency generating device 2400, the processor circuit 110, and the oscillator circuit 120 shown in FIG. 26, reference may be made to the related description of FIG. 25, so there will be no repetition. In the embodiment shown in FIG. 26, the oscillator circuit 120 includes an oscillator 123, and the processor circuit 110 includes a processor 111 and a memory 113. For the processor 111 and the memory 113, the synchronizer 10 and the oscillator 123 shown in FIG. 26, reference may be made to the related description of the processor 111 and the memory 113, the synchronizer 10 and the oscillator 123 shown in FIG. 12, so there will be no repetition. The processor 111 compares the reference frequency of the external reference clock signal Fref with the clock frequency of the clock signal Fout. The processor 111 uses the frequency differences to calculate the current frequency change rate FRATE as the current frequency aging rate value. The processor 111 calculates a frequency regulation value FREG based on the current frequency aging rate value and the oscillator resolution of the synchronizer 10. The processor circuit 110 provides the frequency regulation value FREG to the synchronizer 10 in the holdover state to compensate the output frequency Fout24 of the synchronizer 10.

Figure 27:
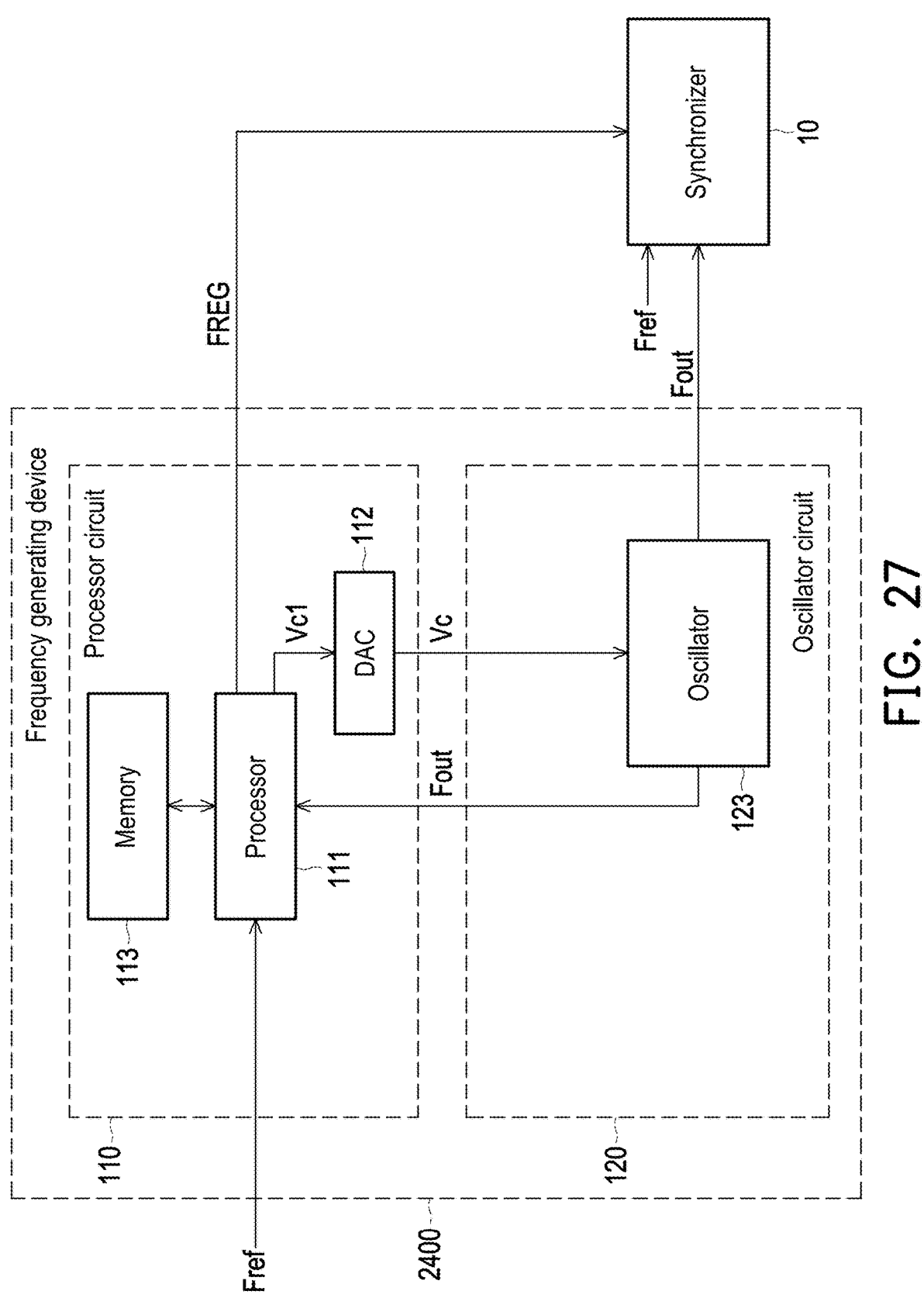
FIG. 27 is a schematic diagram of a circuit block of the processor circuit according to another embodiment of the disclosure.

FIG. 27 is a schematic diagram of a circuit block of the processor circuit 110 according to another embodiment of the disclosure. For the synchronizer 10, the frequency generating device 2400, the processor circuit 110, and the oscillator circuit 120 shown in FIG. 27, reference may be made to the related description of FIG. 24, and for the oscillator circuit 120 shown in FIG. 27, reference may be made to the related description of the oscillator circuit 120 shown in FIG. 26, so there will be no repetition. In the embodiment shown in FIG. 27, the processor circuit 110 includes the processor 111, the DAC 112 and a memory 113. For the processor 111 and the memory 113 shown in FIG. 27, reference may be made to the related description of the processor 111 and the memory 113 shown in FIG. 26, so there will be no repetition. In the embodiment shown in FIG. 27, the DAC 112 is coupled to the processor 111 to receive the control value Vc1. The DAC 112 converts the control value Vc1 into the control voltage Vc for the oscillator circuit 120. Based on the above, the DAC 112 provides the control voltage Vc to the oscillator 123.

Figure 28:
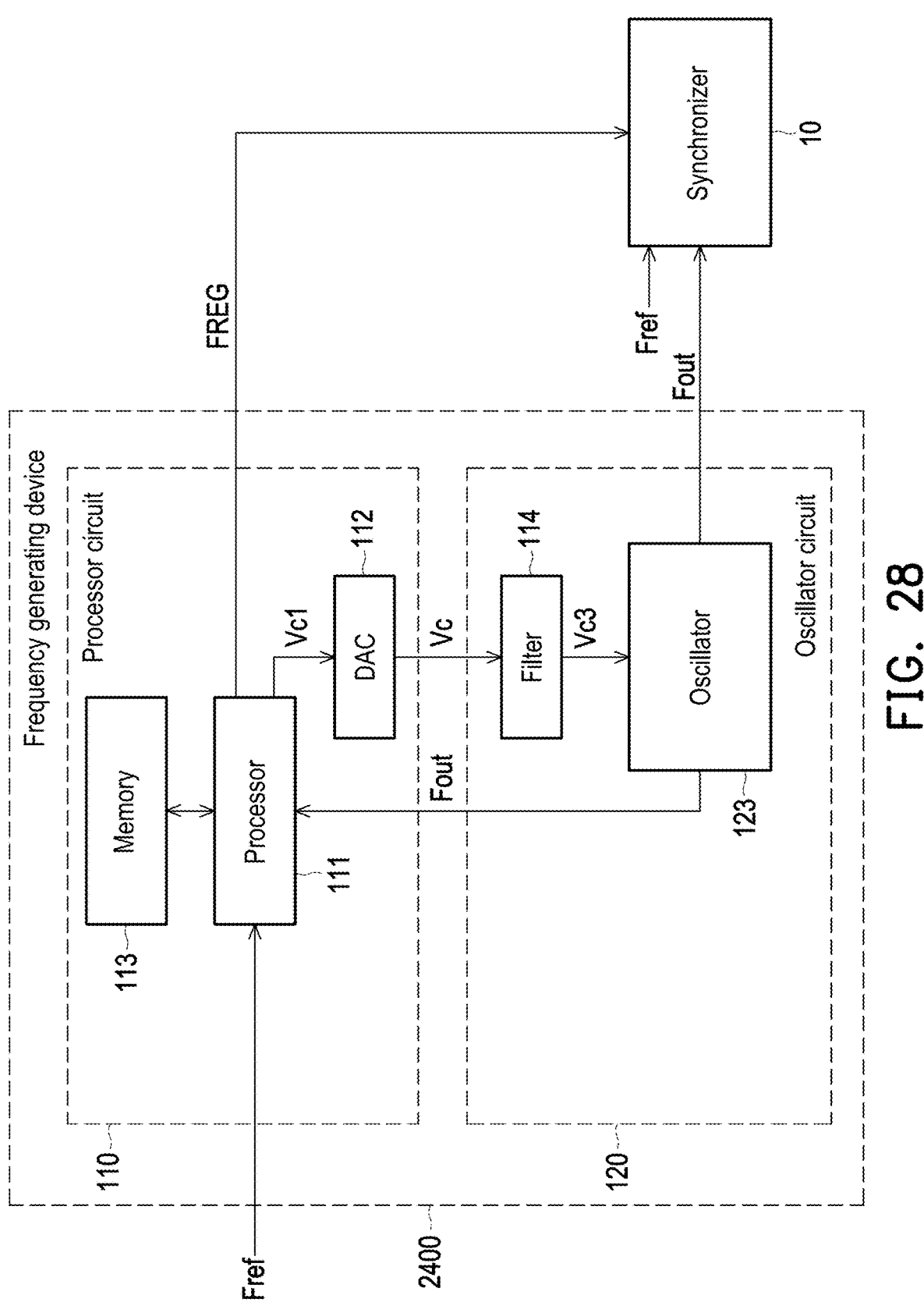
FIG. 28 is a schematic diagram of a circuit block of the oscillator circuit according to another embodiment of the disclosure.

FIG. 28 is a schematic diagram of a circuit block of the oscillator circuit 120 according to another embodiment of the disclosure. For the synchronizer 10, the frequency generating device 2400, the processor circuit 110, and the oscillator circuit 120 shown in FIG. 28, reference may be made to the related description of FIG. 24, and for the processor circuit 110 shown in FIG. 28, reference may be made to the related description of the processor circuit 110 shown in FIG. 27, so there will be no repetition. In the embodiment shown in FIG. 28, the oscillator circuit 120 includes the oscillator 123 and a filter 114. The filter 114 is coupled to the processor circuit 110 to receive the control voltage Vc. The filter 114 may smooth the control voltage Vc to generate the smoothed control voltage Vc3 for the oscillator 123.

Figure 29:
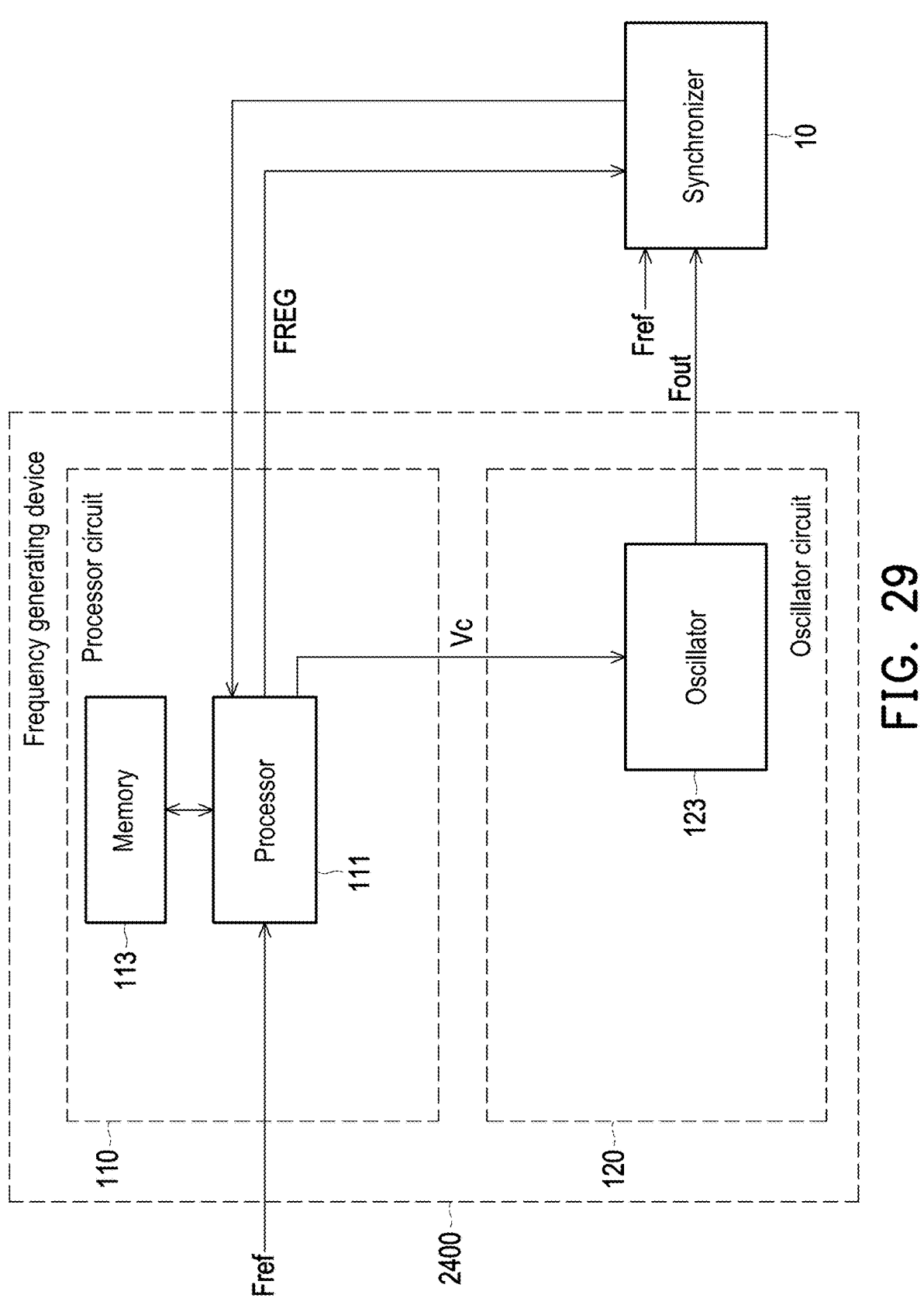
FIG. 29 is a schematic diagram of a circuit block of the processor circuit according to another embodiment of the disclosure.

FIG. 29 is a schematic diagram of a circuit block of the processor circuit 110 according to another embodiment of the disclosure. For the synchronizer 10, the frequency generating device 2400, the processor circuit 110, and the oscillator circuit 120 shown in FIG. 29, reference may be made to the related description of FIG. 24, and for the oscillator circuit 120 shown in FIG. 29, reference may be made to the related description of the oscillator circuit 120 shown in FIG. 26, so there will be no repetition. In the embodiment shown in FIG. 29, the processor circuit 110 includes a processor 111 and a memory 113. For the processor 111 and the memory 113 shown in FIG. 29, reference may be made to the related description of the processor 111 and the memory 113 shown in FIG. 26, so there will be no repetition.

In the embodiment shown in FIG. 29, the synchronizer 10 can compare the reference frequency of the external reference clock signal Fref with the clock frequency of the clock signal Fout at different time points to obtain frequency differences at the different time points, and the processor circuit 110 reads the frequency differences from the synchronizer 10. The processor 111 uses the frequency differences to calculate the current frequency change rate FRATE as the current frequency aging rate value. The processor 111 calculates a frequency regulation value FREG based on the current frequency aging rate value and the oscillator resolution of the synchronizer 10. The processor circuit 110 provides the frequency regulation value FREG to the synchronizer 10 in the holdover state to compensate the output frequency Fout24 of the synchronizer 10.

Figure 30:
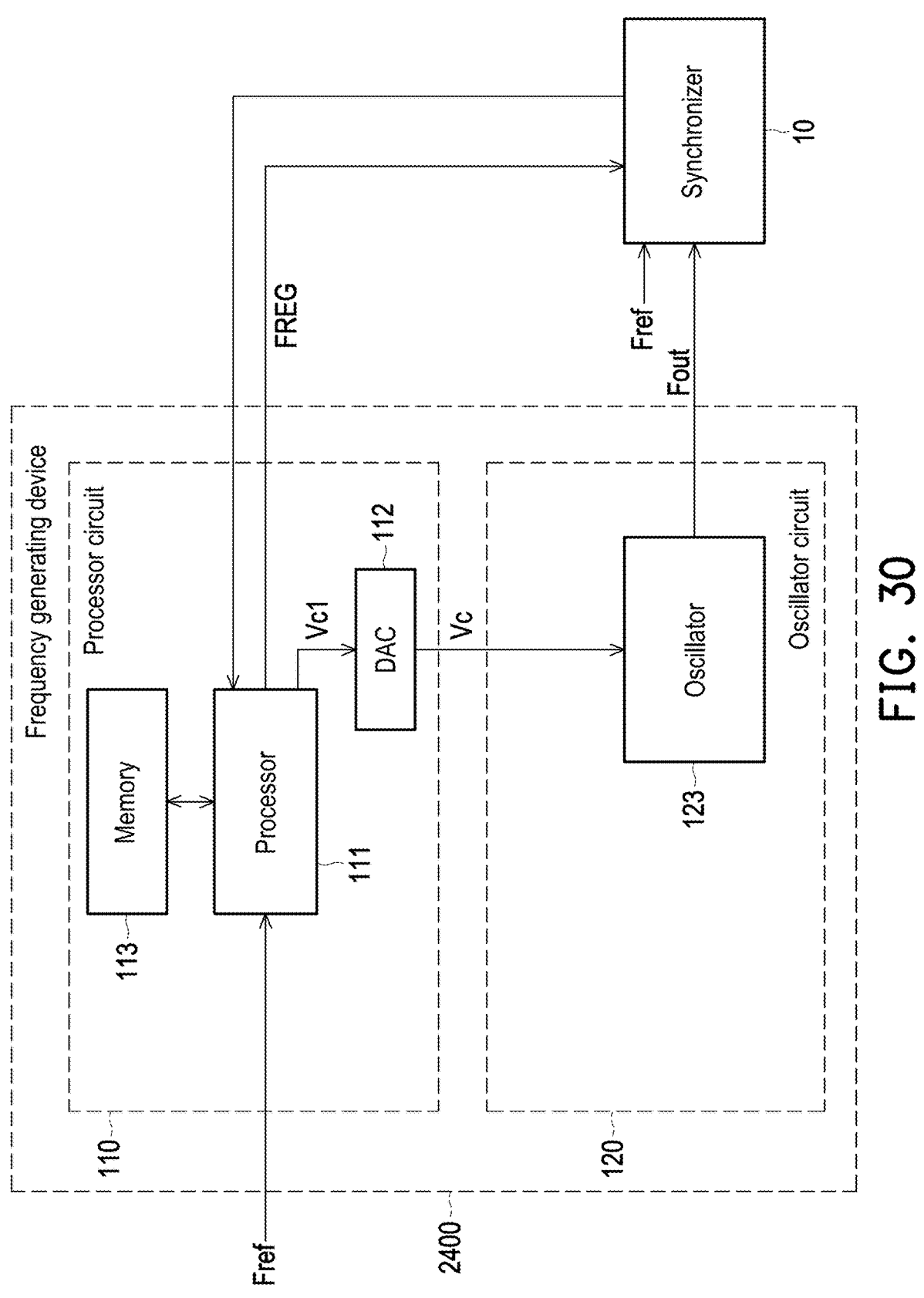
FIG. 30 is a schematic diagram of a circuit block of the processor circuit according to another embodiment of the disclosure.

FIG. 30 is a schematic diagram of a circuit block of the processor circuit 110 according to another embodiment of the disclosure. For the synchronizer 10, the frequency generating device 2400, the processor circuit 110, and the oscillator circuit 120 shown in FIG. 30, reference may be made to the related description of FIG. 24, and for the synchronizer 10 and the oscillator circuit 120 shown in FIG. 30, reference may be made to the related description of the synchronizer 10 and the oscillator circuit 120 shown in FIG. 29, so there will be no repetition. In the embodiment shown in FIG. 30, the processor circuit 110 includes the processor 111, the DAC 112, and a memory 113. For the processor 111 and the memory 113 shown in FIG. 30, reference may be made to the related description of the processor 111 and the memory 113 shown in FIG. 26, so there will be no repetition. In the embodiment shown in FIG. 30, the processor 111 compensates a control value Vc1 by using the control voltage regulation rate value Rreg. The DAC 112 is coupled to the processor 111 to receive the control value Vc1. The DAC 112 converts the control value Vc1 into the control voltage Vc for the oscillator circuit 120. Based on the above, the DAC 112 provides the compensated control voltage Vc to the oscillator 123, so as to perform frequency aging compensation on the clock frequency of the clock signal Fout.

Figure 31:
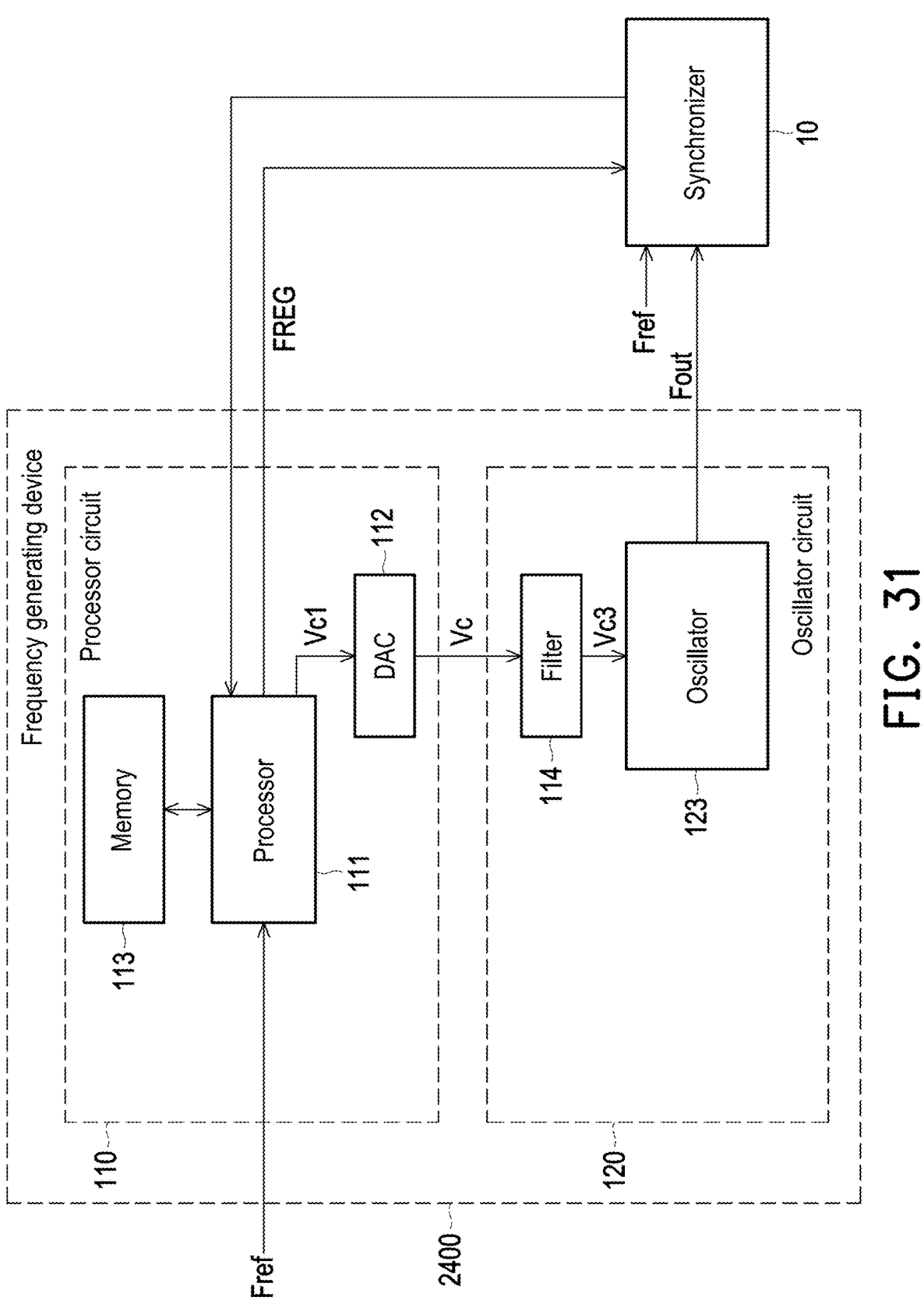
FIG. 31 is a schematic diagram of a circuit block of the oscillator circuit according to another embodiment of the disclosure.

FIG. 31 is a schematic diagram of a circuit block of the oscillator circuit 120 according to another embodiment of the disclosure. For the synchronizer 10, the frequency generating device 2400, the processor circuit 110, and the oscillator circuit 120 shown in FIG. 31, reference may be made to the related description of FIG. 24, and for the processor circuit 110 shown in FIG. 31, reference may be made to the related description of the processor circuit 110 shown in FIG. 30, so there will be no repetition. In the embodiment shown in FIG. 31, the oscillator circuit 120 includes the oscillator 123 and a filter 114. The filter 114 is coupled to the processor circuit 110 to receive the control voltage Vc. The filter 114 may smooth the control voltage Vc to generate the smoothed control voltage Vc3 for the oscillator 123.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A frequency generating device comprising:
an oscillator circuit configured to generate a clock signal to a synchronizer and adjust a clock frequency of the clock signal according to a control voltage; and
a processor circuit coupled to the oscillator circuit and configured to generate the control voltage, wherein
the processor circuit calculates a current frequency aging rate value of the oscillator circuit based on a current clock frequency of the clock signal, the current frequency aging rate value is related to a current frequency change rate of the clock signal before entering a holdover state, the processor circuit calculates a control voltage regulation rate value based on the current frequency aging rate value and a control voltage slope of the oscillator circuit, the control voltage slope represents a slope of a relationship curve of the control voltage to the clock frequency, and the processor circuit compensates the control voltage based on the control voltage regulation rate value in the holdover state; or
the processor circuit calculates the current frequency aging rate value of the oscillator circuit based on the current clock frequency of the clock signal, the processor circuit calculates a frequency regulation value based on the current frequency aging rate value and an oscillator resolution of the synchronizer, the oscillator resolution represents a frequency regulation granularity of an oscillator in the synchronizer, and the processor circuit provides the frequency regulation value to the synchronizer in the holdover state to compensate an output frequency of the synchronizer.

2. The frequency generating device of claim 1, wherein an operation of calculating the current frequency aging rate value of the oscillator circuit comprises:
comparing a reference frequency of an external reference clock signal with the clock frequency of the clock signal at a first time point before entering the holdover state to obtain a first frequency difference;
comparing the reference frequency of the external reference clock signal with the current clock frequency of the clock signal at a second time point before entering the holdover state to obtain a second frequency difference; and
using the first frequency difference and the second frequency difference to calculate the current frequency change rate as the current frequency aging rate value.

3. The frequency generating device of claim 1, wherein an operation of calculating the current frequency aging rate value of the oscillator circuit comprises:
reading a first frequency difference from the synchronizer, wherein the first frequency difference is a comparison result of the synchronizer comparing a reference frequency of an external reference clock signal with the clock frequency of the clock signal at a first time point before entering the holdover state;
reading a second frequency difference from the synchronizer, wherein the second frequency difference is a comparison result of the synchronizer comparing the reference frequency of the external reference clock signal with the clock frequency of the clock signal at a second time point before entering the holdover state; and
using the first frequency difference and the second frequency difference to calculate the current frequency change rate as the current frequency aging rate value.

4. The frequency generating device of claim 1, wherein the control voltage slope of the oscillator circuit or the oscillator resolution of the synchronizer is pre-stored in the processor circuit.

5. The frequency generating device of claim 1, wherein the processor circuit reads the control voltage slope of the oscillator circuit from the oscillator circuit, or the processor circuit reads the oscillator resolution of the synchronizer from the synchronizer.

6. The frequency generating device of claim 1, wherein the processor circuit is configured to record a current voltage level of the control voltage before the oscillator circuit is powered down, and the processor circuit uses the current voltage level as an initial control voltage level after the oscillator circuit is powered back on.

7. The frequency generating device of claim 1, wherein the oscillator circuit comprises:
an oscillator coupled to the processor circuit and configured to generate the clock signal according to the control voltage.

8. The frequency generating device of claim 7, wherein the oscillator circuit further comprises:

a filter coupled to the processor circuit to receive the control voltage and configured to smooth the control voltage to generate a smoothed control voltage for the oscillator.

9. The frequency generating device of claim 7, wherein the oscillator circuit further comprises:

a non-volatile memory configured to provide the control voltage slope; and an interface circuit coupled to the non-volatile memory and configured to read the control voltage slope from the non-volatile memory, and provide the control voltage slope to the processor circuit.

10. The frequency generating device of claim 1, wherein the processor circuit comprises:

a processor, coupled to the oscillator circuit, wherein the processor compensates a control value by using the control voltage regulation rate value; and a digital to analog converter, coupled to the processor to receive the control value and configured to convert the control value into the control voltage for the oscillator circuit.

11. The frequency generating device of claim 10, wherein the processor reads the control voltage slope of the oscillator circuit from the oscillator circuit, and the processor calculates a quotient of the current frequency aging rate value and the control voltage slope as the control voltage regulation rate value.

12. An operation method of a frequency generating device, comprising:

generating a control voltage by a processor circuit of the frequency generating device, and generating a clock signal by an oscillator circuit of the frequency generating device;

calculating, by the processor circuit, a current frequency aging rate value of the oscillator circuit based on a current clock frequency of the clock signal, wherein the current frequency aging rate value is related to a current frequency change rate of the clock signal before entering a holdover state;

calculating, by the processor circuit, a control voltage regulation rate value based on the current frequency aging rate value and a control voltage slope of the oscillator circuit, wherein the control voltage slope represents a slope of a relationship curve of the control voltage to the clock frequency;

compensating, by the processor circuit, the control voltage based on the control voltage regulation rate value in the holdover state; and adjusting, by the oscillator circuit, a clock frequency of the clock signal according to the control voltage.

13. The operation method of claim 12, wherein an operation of calculating the current frequency aging rate value of the oscillator circuit comprises:

comparing a reference frequency of an external reference clock signal with the clock frequency of the clock signal at a first time point before entering the holdover state to obtain a first frequency difference;

comparing the reference frequency of the external reference clock signal with the current clock frequency of the clock signal at a second time point before entering the holdover state to obtain a second frequency difference; and using the first frequency difference and the second frequency difference to calculate the current frequency change rate as the current frequency aging rate value.

14. The operation method of claim 12, wherein an operation of calculating the current frequency aging rate value of the oscillator circuit comprises:

reading a first frequency difference from the synchronizer, wherein the first frequency difference is a comparison result of the synchronizer comparing a reference frequency of an external reference clock signal with the clock frequency of the clock signal at a first time point before entering the holdover state;

reading a second frequency difference from the synchronizer, wherein the second frequency difference is a comparison result of the synchronizer comparing the reference frequency of the external reference clock signal with the clock frequency of the clock signal at a second time point before entering the holdover state; and using the first frequency difference and the second frequency difference to calculate the current frequency change rate as the current frequency aging rate value.

15. The operation method of claim 12, wherein the control voltage slope of the oscillator circuit is pre-stored in the processor circuit.

16. The operation method of claim 12, further comprising:

reading, by the processor circuit, the control voltage slope of the oscillator circuit from the oscillator circuit.

17. The operation method of claim 12, further comprising:

recording, by the processor circuit, a current voltage level of the control voltage before the oscillator circuit is powered down; and using, by the processor circuit, the current voltage level as an initial control voltage level after the oscillator circuit is powered back on.

18. An operation method of a frequency generating device, comprising:

generating a control voltage by a processor circuit of the frequency generating device to an oscillator circuit of the frequency generating device, and generating a clock signal by the oscillator circuit to a synchronizer;

calculating, by the processor circuit, a current frequency aging rate value of the oscillator circuit based on a current clock frequency of the clock signal, wherein the current frequency aging rate value is related to a current frequency change rate of the clock signal before entering a holdover state;

calculating, by the processor circuit, a frequency regulation value based on the current frequency aging rate value and an oscillator resolution of the synchronizer, wherein the oscillator resolution represents a frequency regulation granularity of an oscillator in the synchronizer; and providing, by the processor circuit, the frequency regulation value to the synchronizer in the holdover state to compensate an output frequency of the synchronizer.

19. The operation method of claim 18, wherein an operation of calculating the current frequency aging rate value of the oscillator circuit comprises:

comparing a reference frequency of an external reference clock signal with the clock frequency of the clock signal at a first time point before entering the holdover state to obtain a first frequency difference;

comparing the reference frequency of the external reference clock signal with the current clock frequency of the clock signal at a second time point before entering the holdover state to obtain a second frequency difference; and using the first frequency difference and the second frequency difference to calculate the current frequency change rate as the current frequency aging rate value.

20. The operation method of claim 18, wherein an operation of calculating the current frequency aging rate value of the oscillator circuit comprises:

reading a first frequency difference from the synchronizer, wherein the first frequency difference is a comparison result of the synchronizer comparing a reference frequency of an external reference clock signal with the clock frequency of the clock signal at a first time point before entering the holdover state;

reading a second frequency difference from the synchronizer, wherein the second frequency difference is a comparison result of the synchronizer comparing the reference frequency of the external reference clock signal with the clock frequency of the clock signal at a second time point before entering the holdover state; and using the first frequency difference and the second frequency difference to calculate the current frequency change rate as the current frequency aging rate value.

21. The operation method of claim 18, wherein the oscillator resolution of the synchronizer is pre-stored in the processor circuit.

22. The operation method of claim 18, further comprising:

reading, by the processor circuit, the oscillator resolution of the synchronizer from the synchronizer.

23. The operation method of claim 18, further comprising:

recording, by the processor circuit, a current voltage level of the control voltage before the oscillator circuit is powered down; and using, by the processor circuit, the current voltage level as an initial control voltage level after the oscillator circuit is powered back on.

* * * * *